(12) United States Patent
Lee et al.

(10) Patent No.: US 11,069,613 B2
(45) Date of Patent: Jul. 20, 2021

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Woojin Lee, Hwaseong-si (KR); Junghoo Shin, Seoul (KR); Sanghoon Ahn, Hwaseong-si (KR); Junhyuk Lim, Hwaseong-si (KR); Daehan Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 47 days.

(21) Appl. No.: 16/742,233

(22) Filed: Jan. 14, 2020

(65) Prior Publication Data

US 2021/0005548 A1    Jan. 7, 2021

(30) Foreign Application Priority Data

Jul. 3, 2019    (KR) .......................... 10-2019-0080311

(51) Int. Cl.

| | | |
|---|---|---|
| *H01L 23/522* | (2006.01) | |
| *H01L 21/768* | (2006.01) | |
| *H01L 23/528* | (2006.01) | |
| *H01L 23/485* | (2006.01) | |

(52) U.S. Cl.
CPC .... *H01L 23/5226* (2013.01); *H01L 21/76832* (2013.01); *H01L 21/76843* (2013.01); *H01L 23/528* (2013.01); *H01L 23/485* (2013.01); *H01L 23/5283* (2013.01)

(58) Field of Classification Search
CPC .......... H01L 23/5226; H01L 21/76832; H01L 21/76843; H01L 23/528; H01L 21/76804; H01L 21/76807; H01L 23/53295; H01L 21/76834; H01L 21/76849; H01L 21/76897; H01L 21/76829; H01L 23/5283; H01L 23/485
See application file for complete search history.

(56) References Cited

U.S. PATENT DOCUMENTS

| | | |
|---|---|---|
| 6,680,540 B2 | 1/2004 | Nakano et al. |
| 9,153,538 B2 | 10/2015 | Ko et al. |
| 9,318,439 B2 | 4/2016 | Yang et al. |
| 9,324,650 B2 | 4/2016 | Edelstein et al. |
| 9,496,169 B2 | 11/2016 | Tung et al. |
| 9,553,017 B2 | 1/2017 | Zhang |
| 9,659,864 B2 | 5/2017 | Wu et al. |

(Continued)

*Primary Examiner* — Patricia D Reddington
(74) *Attorney, Agent, or Firm* — Myers Bigel, P.A.

(57) ABSTRACT

An integrated circuit device includes a first insulation layer on a substrate, a lower wiring structure in the first insulation layer and including a metal layer and a conductive barrier layer, such that the metal layer is on the conductive barrier layer, an etch stop layer overlapping an upper surface of the first insulation layer and an upper surface of the conductive barrier layer and having a first thickness, a capping layer overlapping a portion of the upper surface of the metal layer and having a second thickness which is less than the first thickness, a second insulation layer overlapping the etch stop layer and the capping layer, and an upper wiring structure connected to another portion of the upper surface of the metal layer not overlapped by the capping layer in the second insulation layer.

20 Claims, 23 Drawing Sheets

(56) References Cited

U.S. PATENT DOCUMENTS

| | | |
|---|---|---|
| 9,818,690 B2 | 11/2017 | Tsai et al. |
| 9,911,690 B2 | 3/2018 | Edelstein et al. |
| 9,953,865 B1 | 4/2018 | Briggs et al. |
| 9,966,337 B1 | 5/2018 | Briggs et al. |
| 10,181,421 B1 | 1/2019 | Ryan et al. |
| 10,211,097 B2 | 2/2019 | Huang et al. |
| 2015/0364420 A1* | 12/2015 | Lin ............... H01L 24/05 257/775 |
| 2018/0076132 A1 | 3/2018 | Tsai et al. |
| 2018/0211871 A1 | 7/2018 | Anderson et al. |
| 2018/0211911 A1 | 7/2018 | Wu et al. |

* cited by examiner

INTEGRATED CIRCUIT DEVICE AND METHOD OF MANUFACTURING THE SAME

CROSS-REFERENCE TO RELATED APPLICATION

This application claims the benefit of Korean Patent Application No. 10-2019-0080311, filed on Jul. 3, 2019, in the Korean Intellectual Property Office, the disclosure of which is incorporated herein in its entirety by reference.

BACKGROUND

The inventive concept relates to an integrated circuit device and a method of manufacturing the same, and more particularly, to an integrated circuit device including a multi-layer wiring structure and a method of manufacturing the integrated circuit device.

As the electronics industry rapidly advances and the requirements of users increase, electronic devices are being equipped with multiple functions and becoming more and more miniaturized. Therefore, down-scaling of integrated circuit devices is proceeding rapidly, and a line width and a pitch of a multi-layer wiring structure included in each of the integrated circuit devices may be reduced.

SUMMARY

The inventive concept provides an integrated circuit device, which prevents a leakage current of a multi-layer wiring structure to prevent the time dependent dielectric breakdown (TDDB) of the integrated circuit device, and thus, enhances electrical characteristic and reliability, and a method of manufacturing the integrated circuit device.

The inventive concept provides an integrated circuit device, which has a structure for considerably decreasing a possibility that a short circuit between an upper wiring structure and a lower wiring structure adjacent thereto occurs even when unexpected misalignment occurs due to the insufficiency of a process margin in performing a process of forming the upper wiring structure, and thus, enhances electrical characteristic and reliability, and a method of manufacturing the integrated circuit device.

The object of the inventive concept is not limited to the aforesaid, but other objects not described herein will be clearly understood by those of ordinary skill in the art from descriptions below.

According to some embodiments of the inventive concept, there is provided an integrated circuit device including a first insulation layer on a substrate, a lower wiring structure in the first insulation layer and including a metal layer and a conductive barrier layer surrounding the metal layer in a plan view, an etch stop layer overlapping an upper surface of the first insulation layer and an upper surface of the conductive barrier layer and having a first thickness, a capping layer overlapping a first portion of the upper surface of the metal layer and having a second thickness which is less than the first thickness, a second insulation layer overlapping the etch stop layer and the capping layer, and an upper wiring structure connected to a second portion of the upper surface of the metal layer not overlapped by the capping layer. The upper wiring structure is in the second insulation layer. The upper wiring structure includes a concave-convex structure contacting a portion of an upper surface of the etch stop layer, a sidewall of the etch stop layer, and the second portion of the upper surface of the metal layer.

According to some embodiments of the inventive concept, there is provided an integrated circuit device including a first insulation layer on a substrate, a first wiring structure in the first insulation layer and including a metal layer and a conductive barrier layer surrounding the metal layer, an etch stop layer overlapping an upper surface of the first insulation layer and an upper surface of the conductive barrier layer and having a first thickness, a capping layer overlapping a first portion of the upper surface of the metal layer and having a second thickness which is less than the first thickness, a second insulation layer overlapping the etch stop layer and the capping layer, a second wiring structure on the second insulation layer, an $N^{th}$ (where N is an integer of 3 or more) insulation layer and an $N^{th}$ wiring structure sequentially stacked on the second insulation layer and the second wiring structure, and a via structure connected to a second portion of the upper surface of the metal layer not overlapped by the capping layer to penetrate the second to $N^{th}$ insulation layers. The via structure includes a concave-convex structure contacting a portion of an upper surface of the etch stop layer, a sidewall of the etch stop layer, and the second portion of the upper surface of the metal layer.

According to some embodiments of the inventive concept, there is provided an integrated circuit device including a first insulation layer on a substrate, a lower wiring structure in the first insulation layer and including a metal layer and a conductive barrier layer surrounding the metal layer in a plan view, a first etch stop layer including a first region having a first thickness and a second region having a second thickness which is less than the first thickness, the first region overlapping an upper surface of the first insulation layer and an upper surface of the conductive barrier layer, and the second region overlapping a first portion of an upper surface of the metal layer, a second etch stop layer overlapping the first etch stop layer, a second insulation layer overlapping the second etch stop layer, and an upper wiring structure connected to a second portion of the upper surface of the metal layer not overlapped by the first etch stop layer and the second etch stop layer to penetrate the second insulation layer. The upper wiring structure includes a wiring line extending in a direction vertical to the lower wiring structure and a via intersecting the wiring line. The upper surface of the via includes a rounded corner, and a lower surface of the via includes a concave-convex structure contacting a portion of an upper surface of the first etch stop layer, a sidewall of the first etch stop layer, and the second portion of the upper surface of the metal layer.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments will be described in detail with reference to the accompanying drawings.

FIGS. 1A to 1D are diagrams illustrating an integrated circuit device according to some embodiments.

Figure 1A:
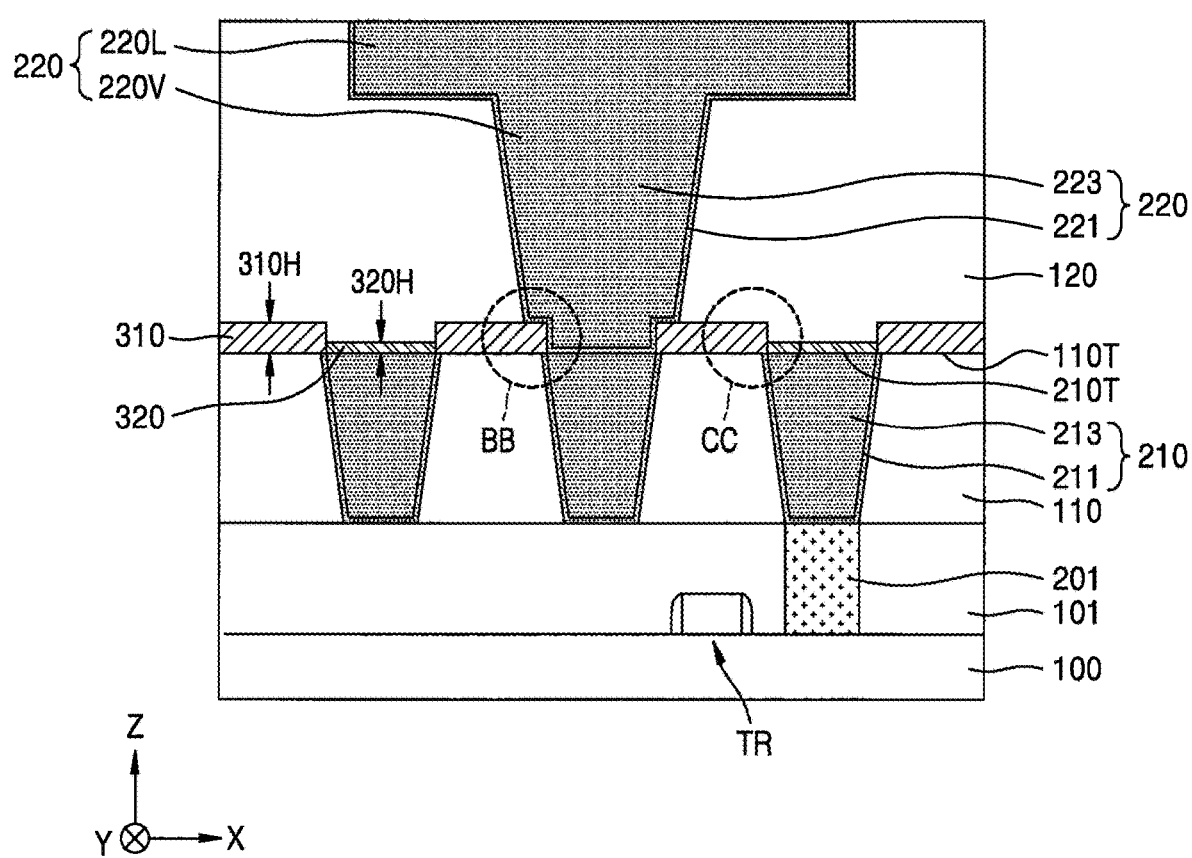
FIGS. 1A to 1D are diagrams illustrating an integrated circuit device according to some embodiments.
Figure 1B:
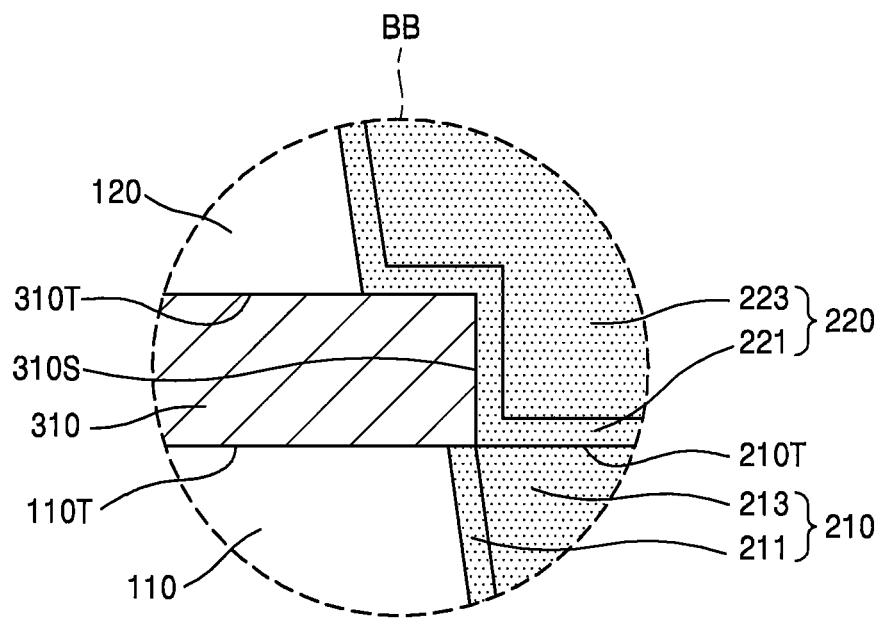
Figure 1C:
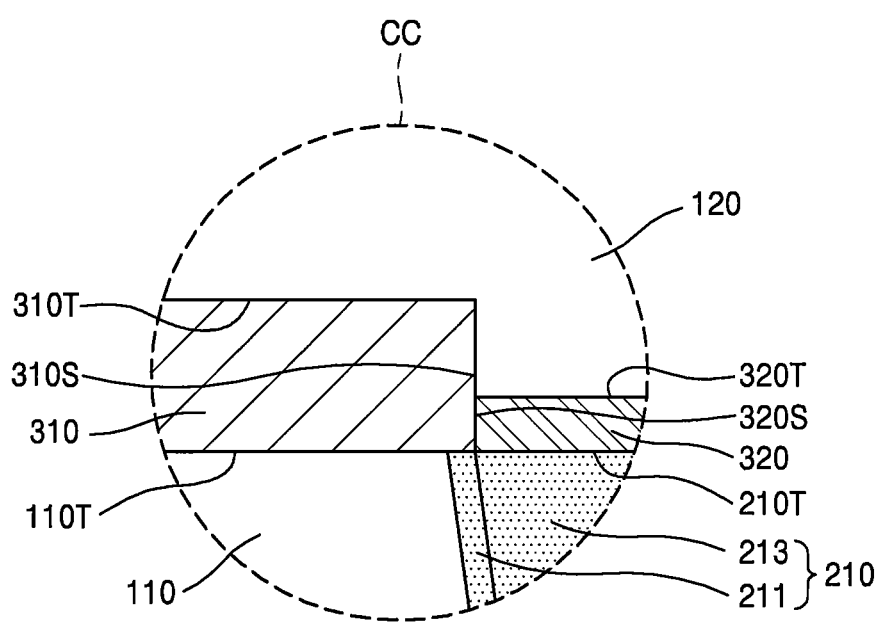
Figure 1D:
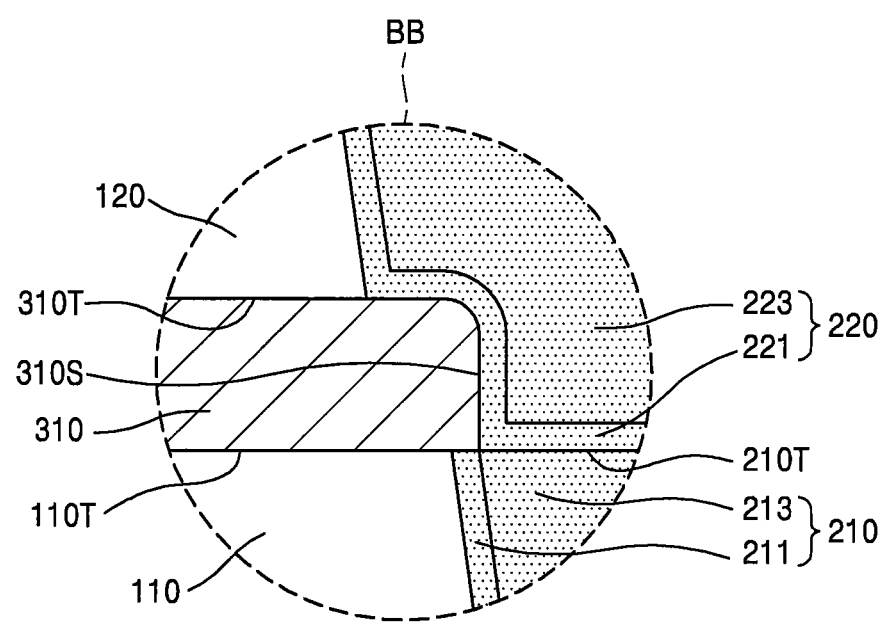

In detail, FIG. 1A is a cross-sectional view of an integrated circuit device 10, FIG. 1B is an enlarged cross-sectional view of a region BB of FIG. 1A, FIG. 1C is an enlarged cross-sectional view of a region CC of FIG. 1A, and FIG. 1D is another enlarged cross-sectional view of a region BB of FIG. 1A.

Referring to FIGS. 1A to 1D, the integrated circuit device 10 may include a first insulation layer 110 formed on a substrate 100, a lower wiring structure 210 passing through the first insulation layer 110, an etch stop layer 310 covering or overlapping an upper surface of the first insulation layer 110, a capping layer 320 covering or overlapping an upper surface of the lower wiring structure 210, a second insulation layer 120 formed on the first insulation layer 110, and an upper wiring structure 220 passing through the second insulation layer 120.

The substrate 100 may include a wafer including silicon (Si). In some embodiments, the substrate 100 may include a wafer including a semiconductor element such as germanium (Ge) or a compound semiconductor such as silicon carbide (SiC), gallium arsenide (GaAs), indium arsenide (InAs), or indium phosphide (InP). The substrate 100 may have a silicon on insulator (SOI) structure. Also, the substrate 100 may include a device region including a transistor TR, an active region, and a field region.

An interlayer insulation layer 101 and a contact plug 201 passing through the interlayer insulation layer 101 may be disposed on the substrate 100. In some embodiments, the interlayer insulation layer 101 may include a Si-based material such as silicon oxide, silicon nitride, or silicon oxynitride. The contact plug 201 may have a conductive structure including metal. The metal may include copper (Cu), tungsten (W), aluminum (Al), cobalt (Co), and/or ruthenium (Ru). In some embodiments, the contact plug 201 may be electrically connected to the active region formed in the substrate 100. For example, the contact plug 201 may be connected to a source/drain electrode or a gate electrode of the transistor TR formed in the substrate 100.

The first insulation layer 110 may be disposed on the interlayer insulation layer 101. In some embodiments, the first insulation layer 110 may include a silicon oxide-based material. For example, the first insulation layer 110 may include plasma enhanced oxide (PEOX), tetraethyl orthosilicate (TEOS), boron TEOS (BTEOS), phosphorous TEOS (PTEOS), boron TESO (BPTEOS), boron silicate glass (BSG), phosphor silicate glass (PSG), or boron phosphor silicate glass (BPSG). In some embodiments, the first insulation layer 110 may include a low dielectric layer (for example, a SiOC layer or a SiCOH layer) having a low dielectric constant of about 2.2 to about 3.0.

The lower wiring structure 210 may be disposed to pass through the first insulation layer 110. The lower wiring structure 210 may include a metal layer 213 and a conductive barrier layer 211 surrounding the metal layer 213. The metal layer 213 may include Cu, W, Al, Co, Ru, or a combination thereof. The conductive barrier layer 211 may include tantalum (Ta), tantalum nitride (TaN), titanium (Ti), titanium nitride (TiN), or a combination thereof. The lower wiring structure 210 may be connected to the contact plug 201.

An upper surface 110T of the first insulation layer 110 and an upper surface of the conductive barrier layer 211 may be covered or overlapped by the etch stop layer 310. In other words, the etch stop layer 310 may be selectively disposed on the upper surface 110T of the first insulation layer 110 and the upper surface of the conductive barrier layer 211. The etch stop layer 310 may include a material having an etch selectivity which differs from that of each of the first insulation layer 110 and the second insulation layer 120. Also, a dielectric constant of a material of the etch stop layer 310 may be greater than that of a material of each of the first insulation layer 110 and the second insulation layer 120. In order to satisfy such a condition, the etch stop layer 310 may include, for example, at least one material selected from among aluminum oxide ($Al_xO_y$), zirconium oxide ($Zr_xO_y$), and/or hafnium oxide ($Hf_xO_y$).

An upper surface 210T of the lower wiring structure 210 may be covered or overlapped by the capping layer 320. In other words, the capping layer 320 may be selectively disposed on the upper surface 210T of the lower wiring structure 210, and for example, may be disposed on only an upper surface of the metal layer 213. The capping layer 320 may include an insulating capping layer, a conductive capping layer, or a combination thereof. The capping layer 320 may include, for example, a carbon-containing layer and/or at least one material selected from among Ti, molybdenum (Mo), Ta, manganese (Mn), Co, and Ru.

The etch stop layer 310 may have a first thickness 310H, and the capping layer 320 may have a second thickness 320H, which is less than the first thickness 310H. Also, a sidewall 310S of the etch stop layer 310 and a sidewall 320S of the capping layer 320 may be disposed to contact each other. That is, the etch stop layer 310 and the capping layer 320 may be formed in a concave-convex structure having a step height. Also, as illustrated in FIG. 1D, the upper surface 310T of the etch stop layer 310 may include a round or rounded corner. This may be a phenomenon occurring because a portion of the upper surface 310T of the etch stop layer 310 is etched in an etching process of exposing the upper surface 210T of the lower wiring structure 210.

The second insulation layer 120 may be disposed on the etch stop layer 310 and the capping layer 320. In some embodiments, the second insulation layer 120 may include a silicon oxide-based material. In other embodiments, the second insulation layer 120 may include a material having a low dielectric constant. The silicon oxide-based material and the material having a low dielectric constant may be substantially as described above of the first insulation layer 110.

A lower surface of the second insulation layer 120 may be disposed to conformally cover or overlap the upper surface 310T of the etch stop layer 310 and the upper surface 320T of the capping layer 320. That is, the lower surface of the second insulation layer 120 may form a concave-convex structure having a phase opposite to that of a concave-convex structure of each of the etch stop layer 310 and the capping layer 320. In other words, a lower portion of the second insulation layer 120 that overlaps the capping layer 320 is at a lower level with respect to the substrate 100 than an upper portion of the second insulation layer 120 that overlaps the etch stop layer 310.

The upper wiring structure 220 may pass through the second insulation layer 120. The upper wiring structure 220 may include a metal layer 223 and a conductive barrier layer 221 surrounding the metal layer 223 in a plan view of the integrated circuit device 10 viewed from the Z-direction. A material of each of the metal layer 223 and the conductive barrier layer 221 may be substantially the same as respective materials of the metal layer 213 and conductive barrier layer 211 of the lower wiring structure 210.

The upper wiring structure 220 may include an upper structure and a lower structure. The upper structure may include a wiring line 220L which extends in a direction vertical to the lower wiring structure 210, and the lower structure may include a via 220V disposed at a position at which the wiring line 220L intersects with the lower wiring structure 210.

The upper wiring structure 220 may directly contact the lower wiring structure 210. That is, the etch stop layer 310 and the capping layer 320 may not be formed on an upper surface of the metal layer 213 connected to the upper wiring structure 220.

In some embodiments, the upper wiring structure 220 may be formed in a concave-convex structure which contacts a portion of the upper surface 310T of the etch stop layer 310, the sidewall 310S of the etch stop layer 310, and the upper surface of the metal layer 213. As seen from a side cross-sectional surface, the etch stop layer 310 may be provided in plurality, and the plurality of etch stop layers 310 may be spaced apart from each other with the metal layer 213 therebetween. A lower surface of the via 220V may contact a portion of the upper surface 310T of each of adjacent etch stop layers 310.

Generally, in an integrated circuit device including an ultra-fine device, a process margin of each of a lower wiring structure and an upper wiring structure may be considerably reduced in performing a lithography process, and due to this, it may be difficult to secure reliability. In order to solve such a problem, a fully aligned via (FAV) process has been proposed, but the FAV process additionally needs a process of recessing an upper surface of a lower wiring structure or a process of selectively forming an insulating barrier layer on an insulation layer and a process of forming an etch stop layer on a concave-convex structure. Such additional processes increase a level of difficulty in a manufacturing process, causing a reduction in productivity and an increase in cost of integrated circuit devices.

In order to solve such a problem, the integrated circuit device 10 according to some embodiments may include a concave-convex structure where the upper surface 110T of the first insulation layer 110 and the upper surface of the conductive barrier layer 211 are covered or overlapped by the etch stop layer 310 and the upper surface of the metal layer 213 is covered or overlapped by the capping layer 320. In other words, the etch stop layer 310 may be selectively disposed on only the upper surface 110T of the first insulation layer 110 and the upper surface of the conductive barrier layer 211, and the capping layer 320 may be selectively disposed on only the upper surface of the metal layer 213. Therefore, the integrated circuit device may have the following advantages.

First, a leakage current of the lower wiring structure 210 may be prevented by the capping layer 320, thereby preventing the time dependent dielectric breakdown (TDDB) of the integrated circuit device 10.

Also, as a line width and a pitch of the lower wiring structure 210 are ultra-fined, the etch stop layer 310 may be formed to be thicker than the capping layer 320 with the lower wiring structure 210 therebetween, and thus, a certain separation distance between the lower wiring structure 210 and the etch stop layer 310 may be ensured. That is, in performing a lithography process of forming the upper wiring structure 220, even when unexpected misalignment occurs due to the insufficiency of a process margin, a possibility that a short circuit between the upper wiring structure 220 and the lower wiring structure 210 adjacent thereto occurs may be considerably reduced.

As a result, the electrical characteristics and reliability of the integrated circuit device 10 may be enhanced.

Figure 2:
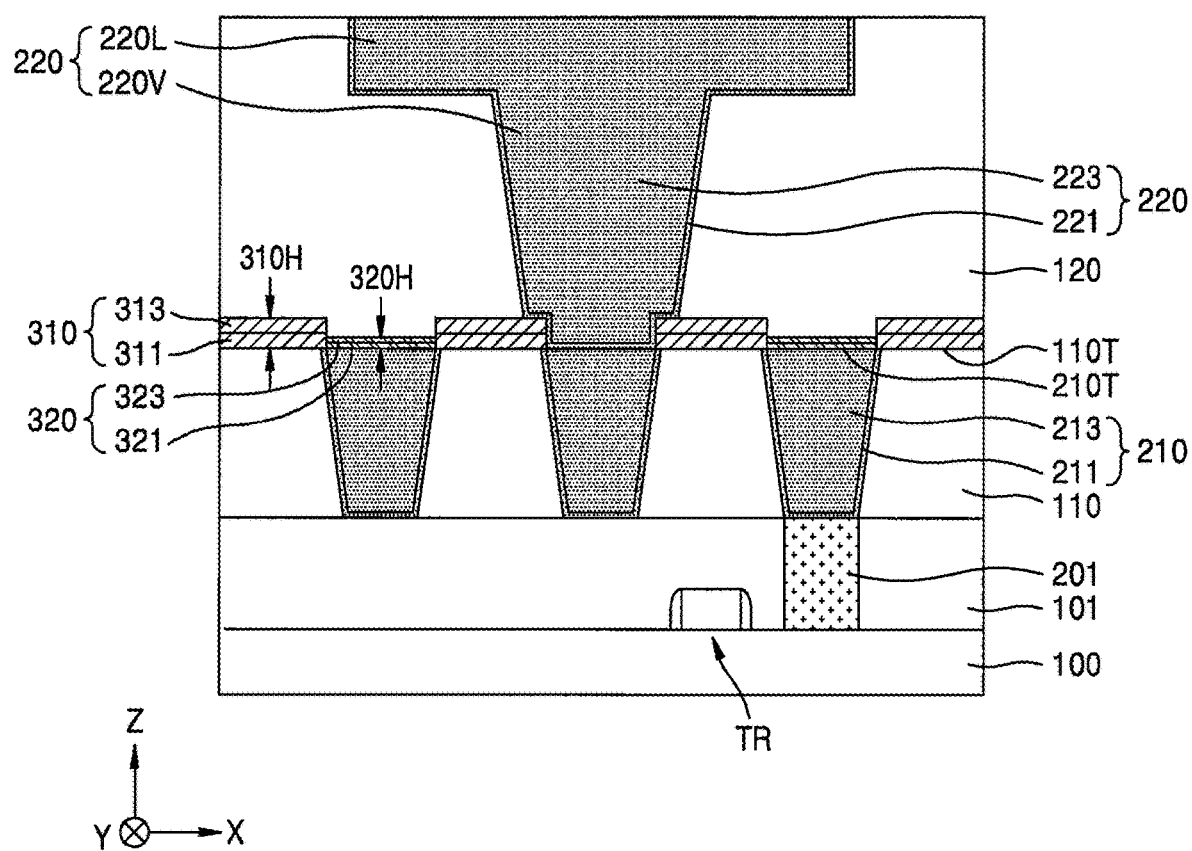
FIGS. 2 to 4 are cross-sectional views illustrating an integrated circuit device according to some embodiments.
Figure 3:
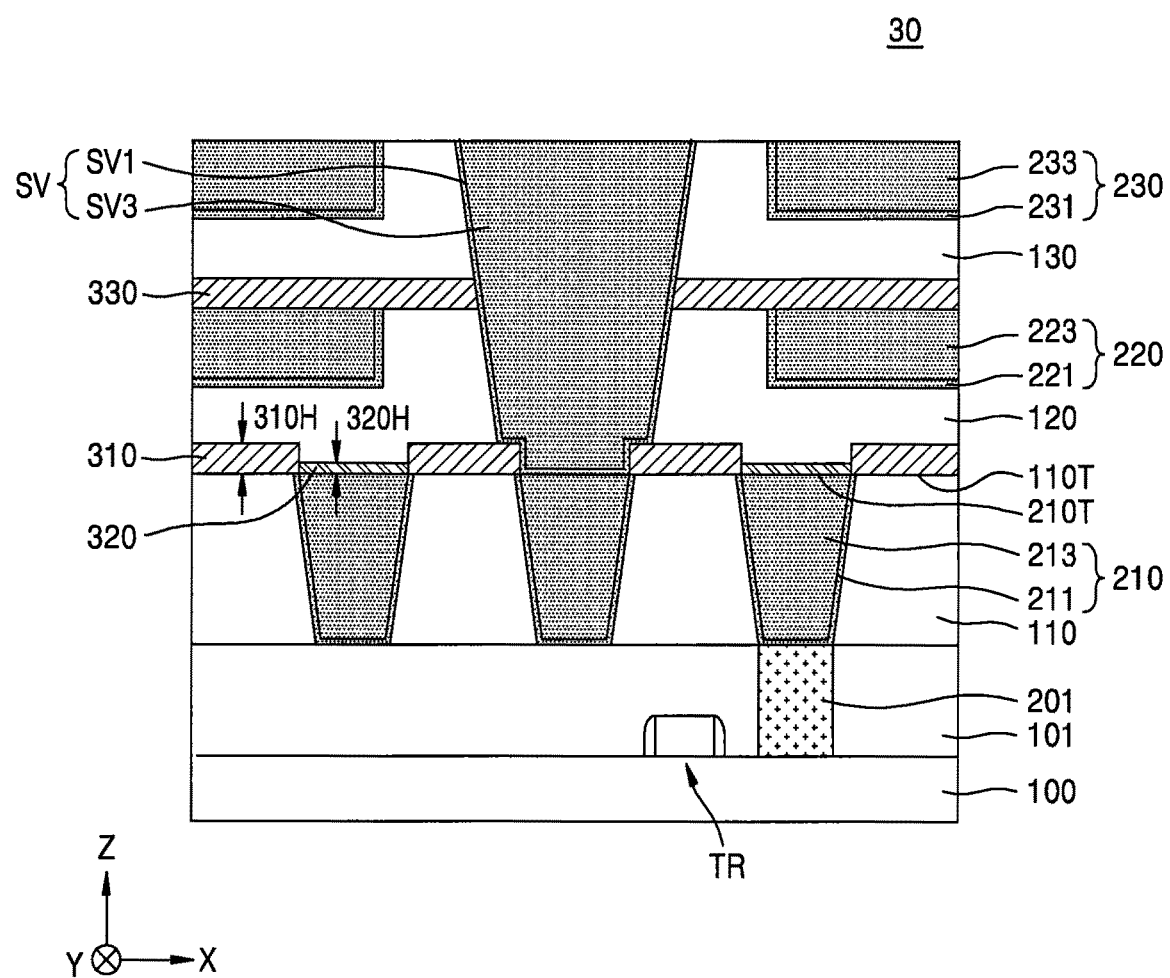
Figure 4:
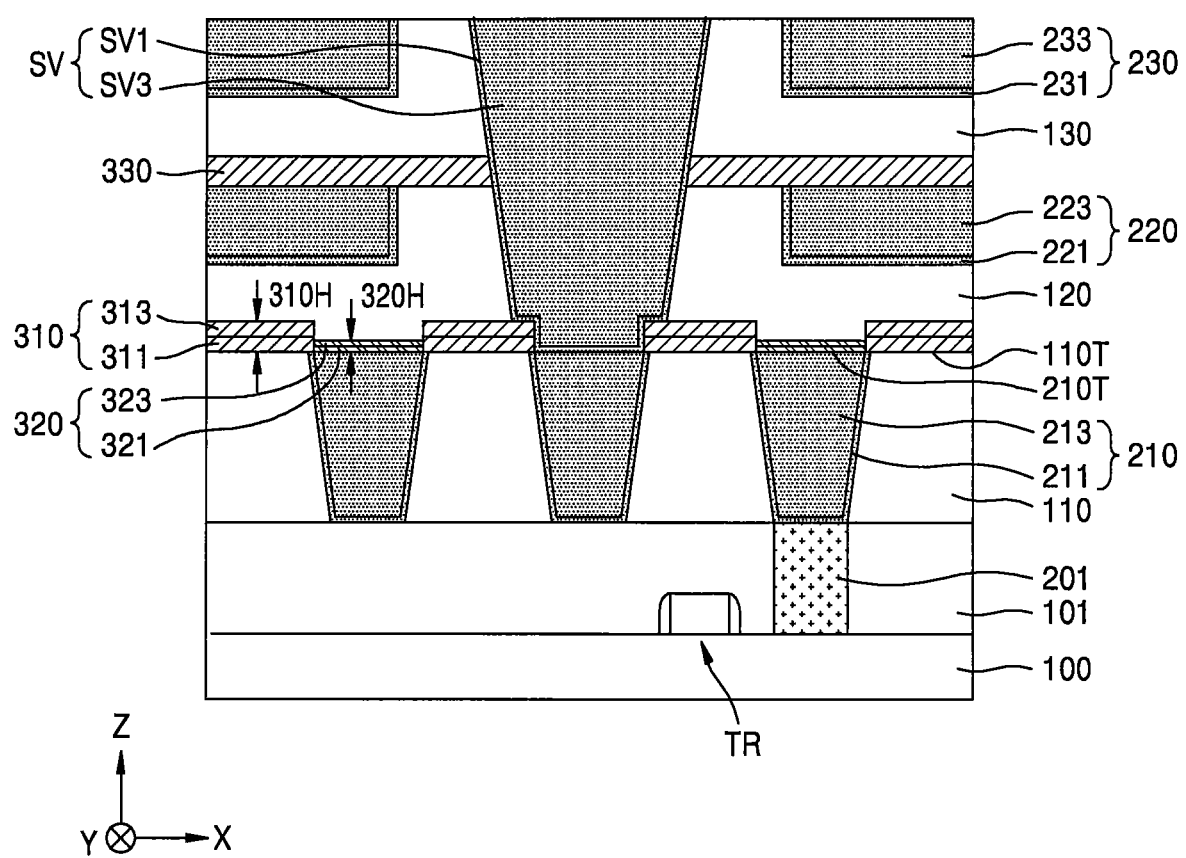

FIGS. 2 to 4 are cross-sectional views illustrating an integrated circuit device according to some embodiments.

Most elements configuring integrated circuit devices 20, 30, and 40 described below and a material of each of the elements may be substantially the same as or similar to descriptions given above with reference to FIGS. 1A to 1D. Therefore, for convenience of description, differences with the integrated circuit device 10 (see FIG. 1A) described above will be mainly described below.

Referring to FIG. 2, the integrated circuit device 20 may include a first insulation layer 110 formed on a substrate 100, a lower wiring structure 210 passing through the first insulation layer 110, an etch stop layer 310 of a composite layer covering or overlapping an upper surface of the first insulation layer 110, a capping layer 320 of a composite layer covering or overlapping an upper surface of the lower wiring structure 210, a second insulation layer 120 formed on the first insulation layer 110, and an upper wiring structure 220 passing through the second insulation layer 120.

The etch stop layer 310 may include a composite layer including a first material layer 311 and a second material layer 313. In some embodiments, the first material layer 311 may be on the first insulation layer 110, and subsequently, the second material layer 313 may be formed on the first material layer 311. The etch stop layer 310 may include three or more composite layers.

A material of the first material layer 311 may differ from that of the second material layer 313. For example, the first material layer 311 may include silicon nitride, carbon-doped silicon nitride, or carbon-doped silicon oxynitride. Also, the second material layer 313 may include metal nitride or metal oxide (for example, $Al_xO_y$, $Zr_xO_y$, and $Hf_xO_y$).

A thickness of the first material layer 311 may differ from that of the second material layer 313. Also, a dielectric constant of the first material layer 311 may differ from that of the second material layer 313. That is, a thickness and/or a dielectric constant of each of the first material layer 311 and the second material layer 312 may be designed to each have a certain value, for reducing or minimizing a capacitance between the lower wiring structure 210 and the upper wiring structure 220.

The capping layer 320 may include a composite layer including a third material layer 321 and a fourth material layer 323. In some embodiments, the third material layer 321 may be on the lower wiring structure 210, and subsequently, the fourth material layer 323 may be formed on the third material layer 321. The capping layer 320 may include three or more composite layers, in some embodiments.

A material of the third material layer 321 may differ from that of the fourth material layer 323. For example, the third material layer 321 may include at least one material selected from among Ti, Mo, Ta, Mn, Co, or Ru. Also, the fourth material layer 323 may include silicon carbide, nitrogen-doped silicon carbide, or a carbon-containing layer such as graphene. That is, the third material layer 321 may include a conductive material layer, and the fourth material layer 323 may include an insulating material layer. Also, the third material layer 321 and the fourth material layer 323 may include materials vice versa.

A thickness of the third material layer 321 may differ from that of the fourth material layer 323. That is, a thickness of each of the third material layer 321 and the fourth material layer 323 may be designed to have a certain thickness value that is selected for preventing or reducing a leakage current of the lower wiring structure 210.

Referring to FIG. 3, the integrated circuit device 30 may include a first insulation layer 110 formed on a substrate 100, a first wiring structure 210 passing through the first insulation layer 110, an etch stop layer 310 covering or overlapping an upper surface of the first insulation layer 110, a capping layer 320 covering or overlapping an upper surface of the first wiring structure 210, a second insulation layer 120 formed on the first insulation layer 110, a second wiring structure 220 passing through the second insulation layer 120, a third insulation layer 130 formed on the second insulation layer 120, a third wiring structure 230 passing through the third insulation layer 130, and a via structure SV.

In the drawing, only the first to third insulation layers 110 to 130 and the first to third wiring structures 210 to 230 are illustrated, but this is merely an embodiment. In some embodiments, an $N^{th}$ (where N is an integer of 3 or more) insulation layer and an $N^{th}$ wiring structure may be sequentially disposed on the second insulation layer 120 and the second wiring structure 220. That is, an insulation layer and a wiring structure may be formed of four or more layers, according to some embodiments.

The first wiring structure 210 may be substantially the same as the lower wiring structure 210 (see FIG. 1A). The second and third wiring structures 220 and 230 may each include a wiring line which extends in a direction vertical or parallel to the first wiring structure 210.

An upper etch stop layer 330 may be on the second insulation layer 120 and the second wiring structure 220. A sidewall of the upper etch stop layer 330 may contact a sidewall of the via structure SV. A material of the upper etch stop layer 330 may be the same as a material of the etch stop layer 310.

A lower surface of the $N^{th}$ insulation layer may be a flat surface which covers or overlaps an upper surface of an $N-1^{th}$ insulation layer and an upper surface of an $N-1^{th}$ wiring structure.

The via structure SV may be disposed to pass through the second and third insulation layers 120 and 130. The via structure SV may include a metal layer SV3 and a conductive barrier layer SV1 surrounding the metal layer SV3. A material of each of the metal layer SV3 and the conductive barrier layer SV1 may be substantially the same as a material of the lower wiring structure 210 (see FIG. 1A). The via structure SV may be formed to pass through two or more insulation layers (second to $N^{th}$ insulation layers), and thus, may be referred to as a super via, for differentiating from a general via.

The via structure SV may directly contact the first wiring structure 210. That is, the etch stop layer 310 and the capping layer 320 may not be formed on an upper surface of the metal layer 213 connected to the via structure SV.

Also, the via structure SV may be formed in a concave-convex structure which contacts a portion of an upper surface 310T of the etch stop layer 310, a sidewall 310S of the etch stop layer 310, and/or the upper surface of the metal layer 213. As seen from a side cross-sectional surface, the etch stop layer 310 may be provided in plurality, and the plurality of etch stop layers 310 may be spaced apart from each other with the metal layer 213 therebetween. A lower surface of the via structure SV may contact a portion of the upper surface 310T of each of adjacent etch stop layers 310.

Referring to FIG. 4, the integrated circuit device 40 may include a first insulation layer 110 formed on a substrate 100, a first wiring structure 210 passing through the first insulation layer 110, an etch stop layer 310 of a composite layer covering or overlapping an upper surface of the first insulation layer 110, a capping layer 320 of a composite layer covering or overlapping an upper surface of the first wiring structure 210, a second insulation layer 120 formed on the first insulation layer 110, a second wiring structure 220 passing through the second insulation layer 120, a third insulation layer 130 formed on the second insulation layer 120, a third wiring structure 230 passing through the third insulation layer 130, and a via structure SV.

A structure of the integrated circuit device 40 may be similar to that of the integrated circuit device 30 described above with reference to FIG. 3. Therefore, differences will be mainly described below.

The etch stop layer 310 may include a composite layer including a first material layer 311 and a second material layer 313. The first material layer 311 and the second material layer 313 may be substantially the same as descriptions given above with reference to FIG. 2.

In some embodiments, the first material layer 311 and the second material layer 313 may be sequentially formed on the first insulation layer 110. The etch stop layer 310 may include three or more composite layers.

A material of the first material layer 311 may differ from that of the second material layer 313. A thickness of the first material layer 311 may differ from that of the second material layer 313. Also, a dielectric constant of the first material layer 311 may differ from that of the second material layer 313.

The capping layer 320 may include a composite layer including a third material layer 321 and a fourth material layer 323. The third material layer 321 and the fourth material layer 323 may be substantially the same as descriptions given above with reference to FIG. 2.

In some embodiments, the third material layer 321 and the fourth material layer 323 may be sequentially formed on the first wiring structure 210. The capping layer 320 may include three or more composite layers.

A material of the third material layer 321 may differ from that of the fourth material layer 323. A thickness of the third material layer 321 may differ from that of the fourth material layer 323.

Figure 5A:
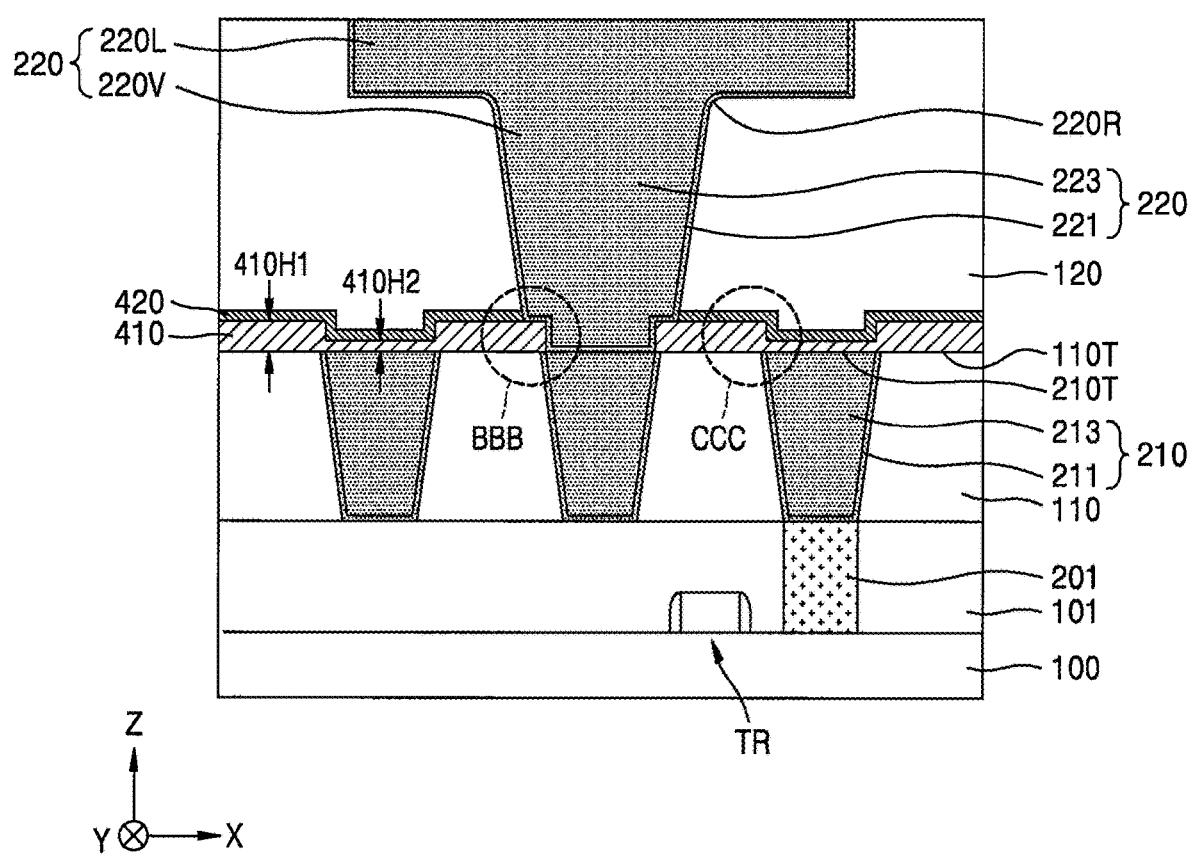
FIGS. 5A to 5C are diagrams illustrating an integrated circuit device according to some embodiments.
Figure 5B:
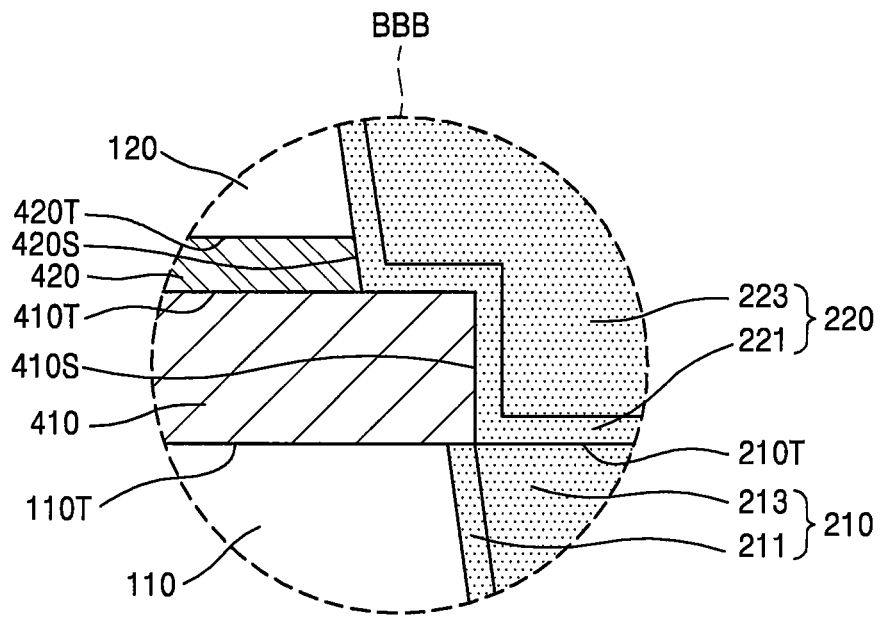
Figure 5C:
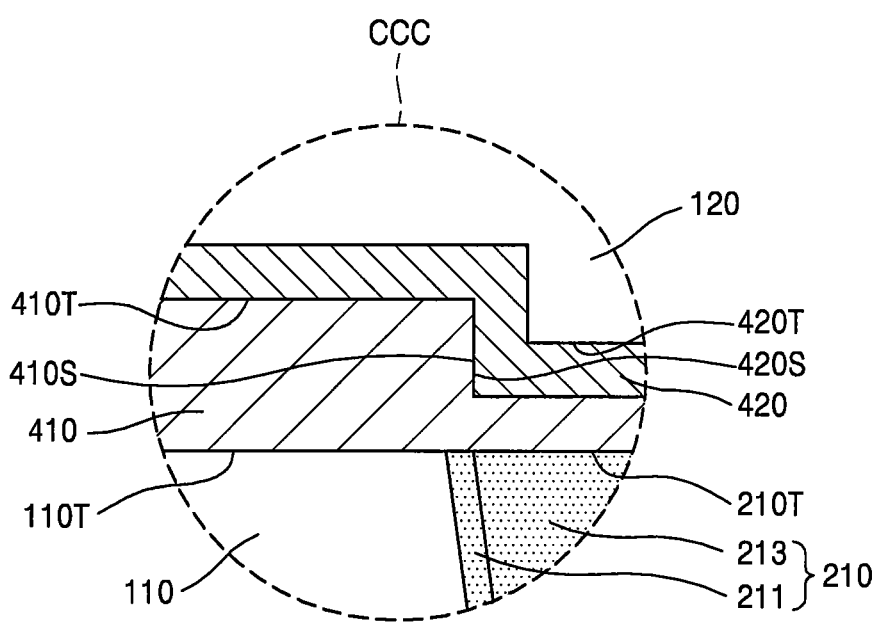

FIGS. 5A to 5C are diagrams illustrating an integrated circuit device 50 according to some embodiments.

Most elements of the integrated circuit device 50 and a material of each of the elements may be substantially the same as or similar to descriptions given above with reference to FIGS. 1A to 1D. Therefore, for convenience of description, differences with the integrated circuit device 10 (see FIG. 1A) described above will be mainly described below.

In detail, FIG. 5A is a cross-sectional view of the integrated circuit device 50, FIG. 5B is an enlarged cross-sectional view of a region BBB of FIG. 5A, and FIG. 5C is an enlarged cross-sectional view of region CCC of FIG. 5A.

Referring to FIGS. 5A to 5C, the integrated circuit device 50 may include a first insulation layer 110 formed on a substrate 100, a lower wiring structure 210 passing through the first insulation layer 110, a first etch stop layer 410 and a second etch stop layer 420 sequentially covering or overlapping an upper surface of the first insulation layer 110 and an upper surface of the lower wiring structure 210, a second insulation layer 120 formed on the first insulation layer 110, and an upper wiring structure 220 passing through the second insulation layer 120.

The first etch stop layer 410 may include a first region having a first thickness 410H1 and a second region having a second thickness 410H2, which is less than the first thickness 410H1. The first region may cover or overlap an upper surface 110T of the first insulation layer 110 and an upper surface of the conductive barrier layer 211. The second region may cover or overlap an upper surface of the metal layer 213.

In other words, a thickness of a portion of the first etch stop layer 410 formed on the upper surface 110T of the first insulation layer 110 and the upper surface of the conductive barrier layer 211 may differ from that of a portion of the first etch stop layer 410 formed on an upper surface of the metal layer 213. The first etch stop layer 410 may be disposed to be relatively thick on only the upper surface 110T of the first insulation layer 110 and the conductive barrier layer 211.

That is, an upper surface 410T of the first etch stop layer 410 may be formed in a concave-convex structure having a step height, and a lower surface of the first etch stop layer 410 may be a flat surface. In other words, the thickness of a portion of the first etch stop layer 410 overlapping the lower wiring structure 210 may be less than a thickness of a portion of the first etch stop layer 410 not overlapping the lower wiring structure 210 (i.e., overlapping the first insulation layer 110).

The first etch stop layer 410 may include a material having an etch selectivity which differs from that of each of the first insulation layer 110 and the second insulation layer 120. The first etch stop layer 410 may include, for example, at least one material selected from among silicon oxide ($Si_xO_y$), silicon oxynitride ($Si_xO_yN_z$), or silicon oxycarbide ($Si_xO_yC_z$).

The second etch stop layer 420 may conformally cover or overlap the first etch stop layer 410. Because the second etch stop layer 420 conformally covers or overlaps the first etch stop layer 410, the second etch stop layer 420 may have a concave-convex structure having the same phase as that of a concave-convex structure of the first etch stop layer 410. That is, each of an upper surface 420T and a lower surface of the second etch stop layer 420 may be formed in a concave-convex structure.

The second etch stop layer 420 may include a material having an etch selectivity which differs from that of the first insulation layer 410. Also, a dielectric constant of a material of the second etch stop layer 420 may be greater than that of a material of the first etch stop layer 410. The second etch stop layer 420 may include, for example, at least one material selected from among $Al_xO_y$, $Zr_xO_y$, or $Hf_xO_y$.

A lower surface of the second insulation layer 120 may conformally cover or overlap the upper surface 420T of the second etch stop layer 420, and thus, may form a concave-convex structure having a phase opposite to that of a concave-convex structure of the second etch stop layer 420.

The upper wiring structure 220 may be disposed to pass through the second insulation layer 120. The upper wiring structure 220 may include a metal layer 223 and a conductive barrier layer 221 surrounding the metal layer 223. A material of each of the metal layer 223 and the conductive barrier layer 221 may be substantially the same as respective materials of the metal layer 213 and conductive barrier layer 211 of the lower wiring structure 210. The upper wiring structure 220 may include an upper structure and a lower structure. The upper structure may include a wiring line 220L which extends in a direction vertical or perpendicular to the lower wiring structure 210, and the lower structure may include a via 220V disposed at a position at which the wiring line 220L intersects with the lower wiring structure 210.

An upper surface of the via 220V may include a round corner 220R. That is, the round corner 220R may be disposed at a portion where the wiring line 220L contacts the via 220V, and thus, a fill process of forming the metal layer 223 and the conductive barrier layer 221 may be more efficiently performed.

The upper wiring structure 220 may directly contact the lower wiring structure 210. That is, the first etch stop layer 410 and the second etch stop layer 420 may not be formed on an upper surface of the metal layer 213 connected to the upper wiring structure 220, according to some embodiments.

Also, the upper wiring structure 220 may be formed in a concave-convex structure which contacts a portion of the upper surface 410T of the first etch stop layer 410, a sidewall 410S of the first etch stop layer 410, a sidewall 420S of the second etch stop layer 420, and the upper surface of the metal layer 213. In other words, the upper wiring structure 220 may contact the first etch stop 410 and the second etch stop layer 420 in a stepped shape.

Figure 6:
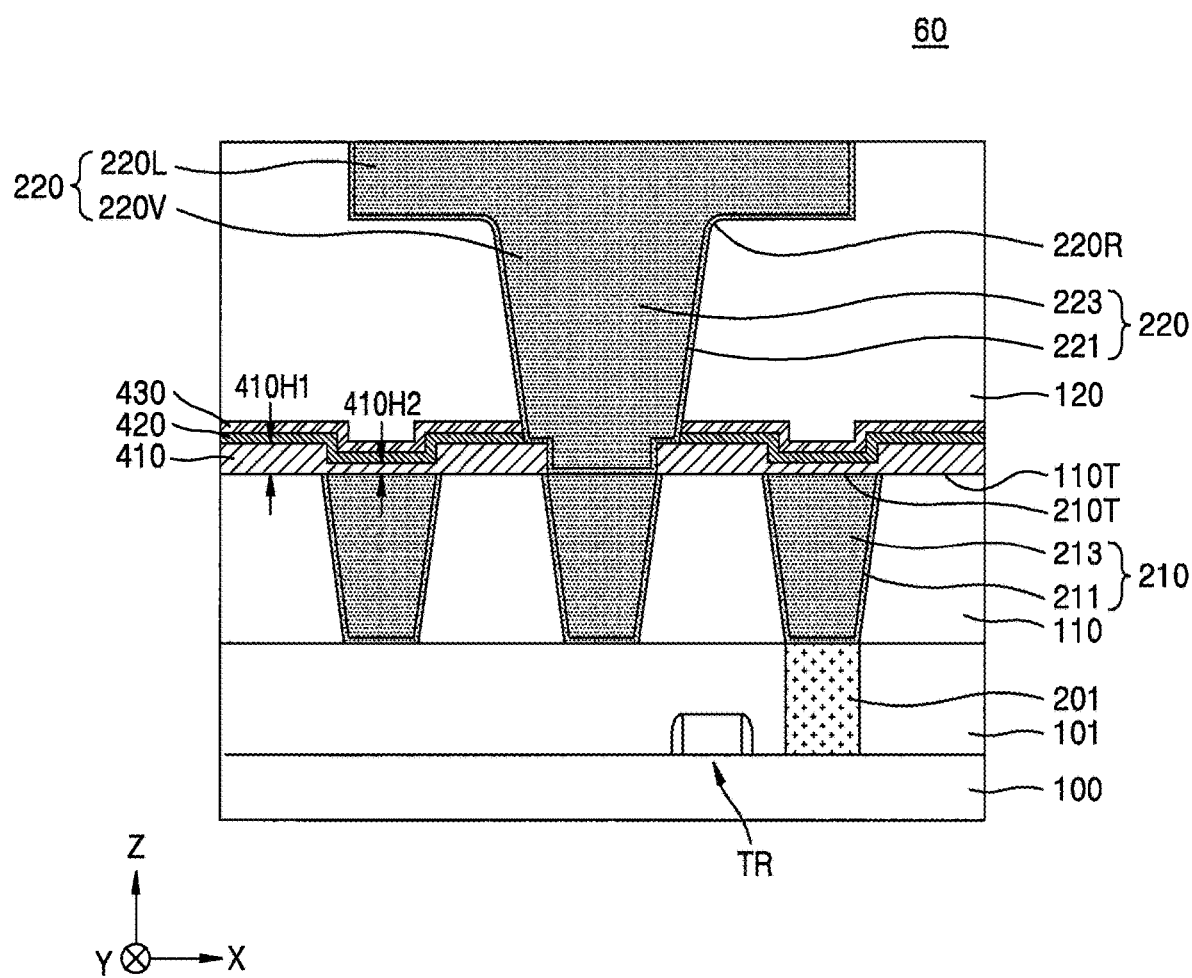
FIG. 6 is a cross-sectional view illustrating an integrated circuit device according to some embodiments.

FIG. 6 is a cross-sectional view illustrating an integrated circuit device 60 according to some embodiments.

Most elements of the integrated circuit device 60 and a material of each of the elements may be substantially the same as or similar to descriptions given above with reference to FIGS. 5A to 5C. Therefore, for convenience of description, differences with the integrated circuit device 50 (see FIG. 5A) described above will be mainly described below.

Referring to FIG. 6, the integrated circuit device 60 may include a first insulation layer 110 formed on a substrate 100, a lower wiring structure 210 passing through the first insulation layer 110, first to third etch stop layers 410 to 430 sequentially covering or overlapping an upper surface of the first insulation layer 110 and an upper surface of the lower wiring structure 210, a second insulation layer 120 formed on the first insulation layer 110, and an upper wiring structure 220 passing through the second insulation layer 120.

The third etch stop layer 430 may conformally cover or overlap the second etch stop layer 420. Because the third etch stop layer 430 conformally covers or overlaps the second etch stop layer 420, the third etch stop layer 430 may have a concave-convex structure having the same phase as that of a concave-convex structure of the second etch stop layer 420. That is, each of an upper surface and a lower surface of the third etch stop layer 430 may be formed in a concave-convex structure.

The third etch stop layer 430 may include a material having an etch selectivity which differs from that of the second insulation layer 420. Also, a dielectric constant of a material of the third etch stop layer 430 may be greater than that of a material of the second etch stop layer 420. The third etch stop layer 430 may include, for example, at least one material selected from among $Al_xO_y$, Zr-doped $Al_xO_y$, Hf-doped $Al_xO_y$, aluminum nitride ($Al_xN_y$), silicon carbonitride ($Si_xC_yN_z$), $Zr_xO_y$, or $Hf_xO_y$.

Figure 7:
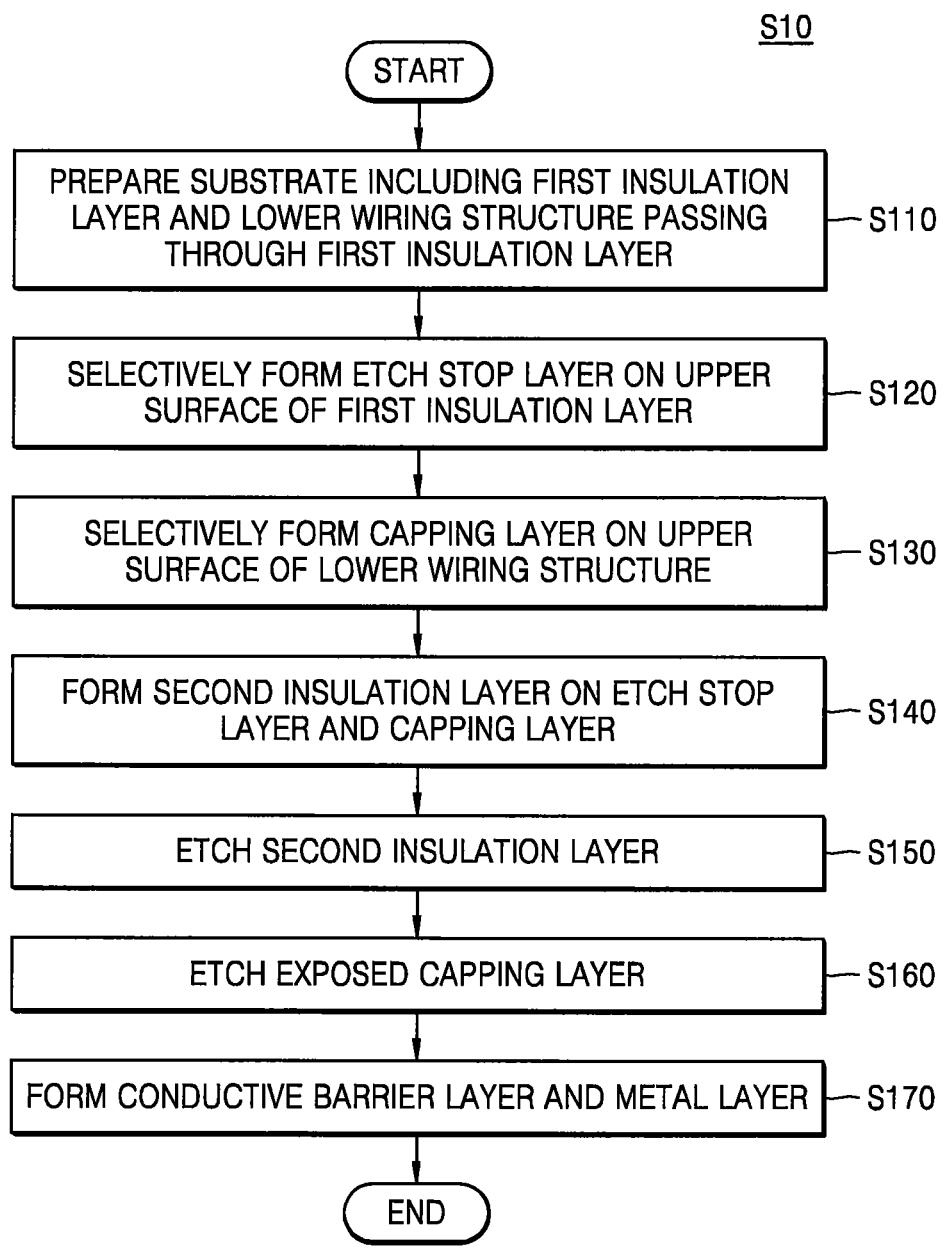
FIG. 7 is a flowchart illustrating a method of manufacturing an integrated circuit device, according to some embodiments.

FIG. 7 is a flowchart illustrating a method S10 of manufacturing an integrated circuit device, according to some embodiments.

Referring to FIG. 7, the method S10 of manufacturing the integrated circuit device may include first operation S110 of preparing a substrate including a first insulation layer and a lower wiring structure passing through the first insulation layer, second operation S120 of selectively forming an etch stop layer on an upper surface of the first insulation layer, third operation S130 of selectively forming a capping layer on an upper surface of the lower wiring structure, fourth operation S140 of forming a second insulation layer on the etch stop layer and the capping layer, fifth operation S150 of etching the second insulation layer, sixth operation S160 of etching an exposed capping layer, and seventh operation S170 of forming a conductive barrier layer and a metal layer. Operations S110 through S170 are not necessarily performed in the order described, according to some embodiments.

The method S10 of manufacturing the integrated circuit device may include operations S110 to S170 of a manufacturing process. When some embodiments are implemented differently, a specific process may be performed unlike a described sequence. For example, two processes successively described may be substantially performed at the same time and may be performed in a sequence opposite to or different from a described sequence.

Technical features of first to seventh operations S110 to S170 will be described below in detail with reference to FIGS. 8A to 8G.

FIGS. 8A to 8G are cross-sectional views illustrating a method of manufacturing an integrated circuit device in a process sequence, according to some embodiments.

Figure 8A:
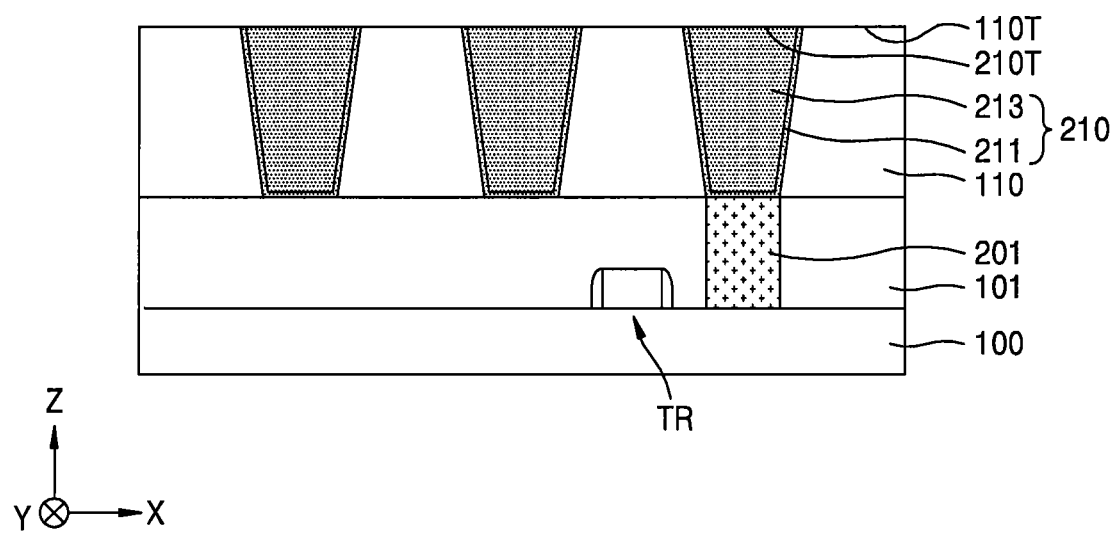
FIGS. 8A to 8G are cross-sectional views illustrating a method of manufacturing an integrated circuit device in a process sequence, according to some embodiments.

Referring to FIG. 8A, a substrate 100 including a first insulation layer 110 and a lower wiring structure 210 passing through the first insulation layer 110 may be prepared.

The substrate 100 may include a wafer including Si. Also, the substrate 100 may include a device region including a transistor TR, an active region, and/or a field region.

An interlayer insulation layer 101 and a contact plug 201 passing through the interlayer insulation layer 101 may be disposed on the substrate 100. In some embodiments, the contact plug 201 may be connected to a source/drain electrode or a gate electrode of the transistor TR formed in the substrate 100.

The first insulation layer 110 may be disposed on the interlayer insulation layer 101. The lower wiring structure 210 may be disposed to pass through the first insulation layer 110. The lower wiring structure 210 may include a metal layer 213 and a conductive barrier layer 211 surrounding the metal layer 213. The lower wiring structure 210 may be connected to the contact plug 201.

Figure 8B:
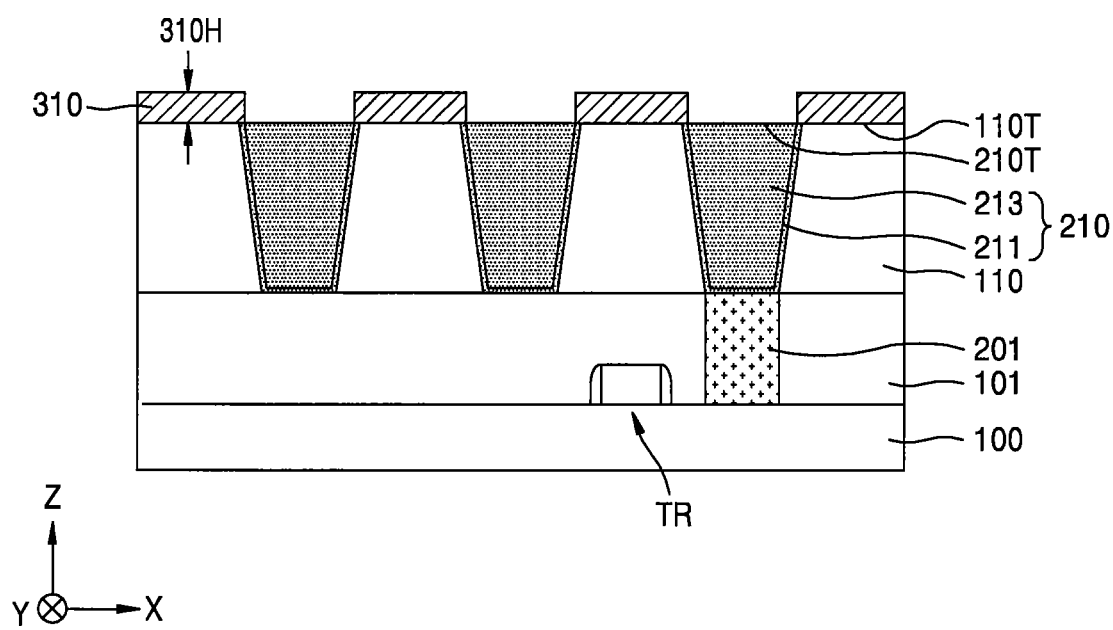

Referring to FIG. 8B, the etch stop layer 310 may be selectively formed on an upper surface 110T of the first insulation layer 110.

The etch stop layer 310 may cover or overlap the upper surface 110T of the first insulation layer 110 and an upper surface of the conductive barrier layer 211. In other words, the etch stop layer 310 may be formed to be selectively disposed on only the upper surface 110T of the first insulation layer 110 and the upper surface of the conductive barrier layer 211. The etch stop layer 310 may include a material having an etch selectivity which differs from that of each of the first insulation layer 110 and the second insulation layer 120. Also, a dielectric constant of a material of the etch stop layer 310 may be greater than that of a material of each of the first insulation layer 110 and the second insulation layer 120.

A process of forming the etch stop layer 310 may be performed under a condition which reacts with a material of each of the first insulation layer 110 and the conductive barrier layer 211 and does not react with a material of the metal layer 213. For example, the etch stop layer 310 may be selectively formed by using a difference between interface energy of a material of the first insulation layer 110 and interface energy of a material of the lower wiring structure 210.

The etch stop layer 310 may be formed to have a first thickness 310H. That is, a process of forming the etch stop layer 310 may be performed in order for the etch stop layer 310 to have a certain thickness on the basis of a subsequent process.

Figure 8C:
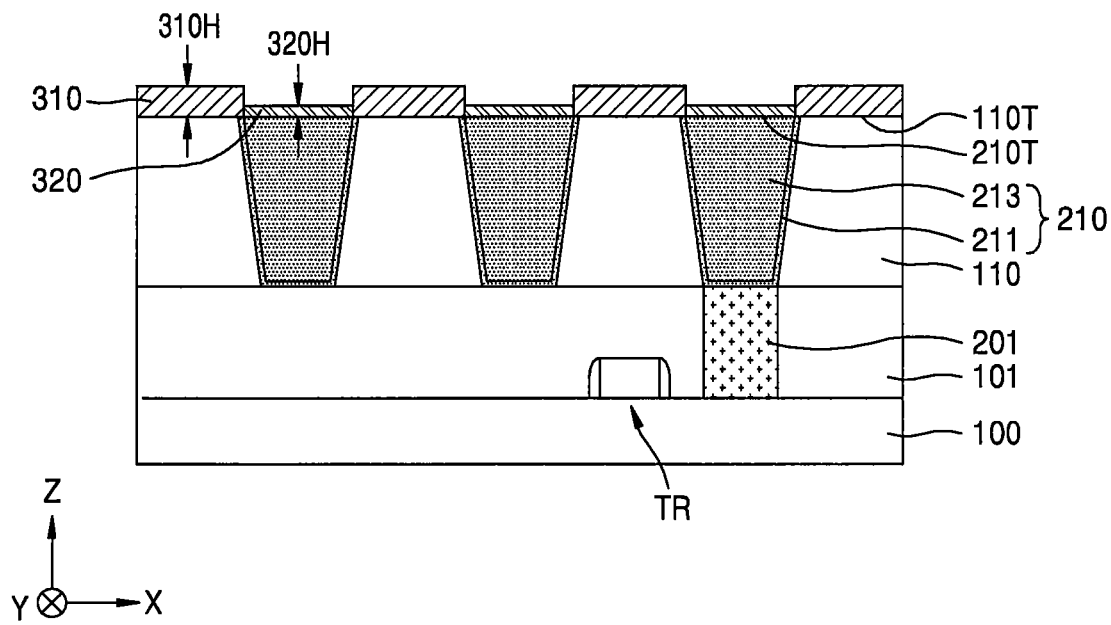

Referring to FIG. 8C, a capping layer 320 may be selectively formed on an upper surface 210T of the lower wiring structure 210.

The capping layer 320 may cover or overlap an upper surface of the metal layer 213. In other words, the capping layer 320 may be formed to be selectively disposed on only the upper surface of the metal layer 213, but not the conductive barrier layer 211 surrounding the metal layer 213. Because the capping layer 320 is formed, a leakage current of the lower wiring structure 210 may be prevented or reduced.

A process of forming the capping layer 320 may be performed under a condition which reacts with a material of the metal layer 213 and does not react with a material of the etch stop layer 310. For example, the capping layer 320 may be selectively formed by using a difference between interface energy of a material of the metal layer 213 and interface energy of a material of the etch stop layer 310.

The capping layer 320 may be formed to have a second thickness 320H. The etch stop layer 310 may have the first thickness 310H, and the capping layer 320 may have the second thickness 320H, which is less than the first thickness 310H. That is, a thickness of the etch stop layer 310 may be greater than that of the capping layer 320. Also, a sidewall 310S of the etch stop layer 310 and a sidewall 320S of the capping layer 320 may be formed to contact each other. That is, the etch stop layer 310 and the capping layer 320 may be formed in a concave-convex structure having a step height.

Figure 8D:
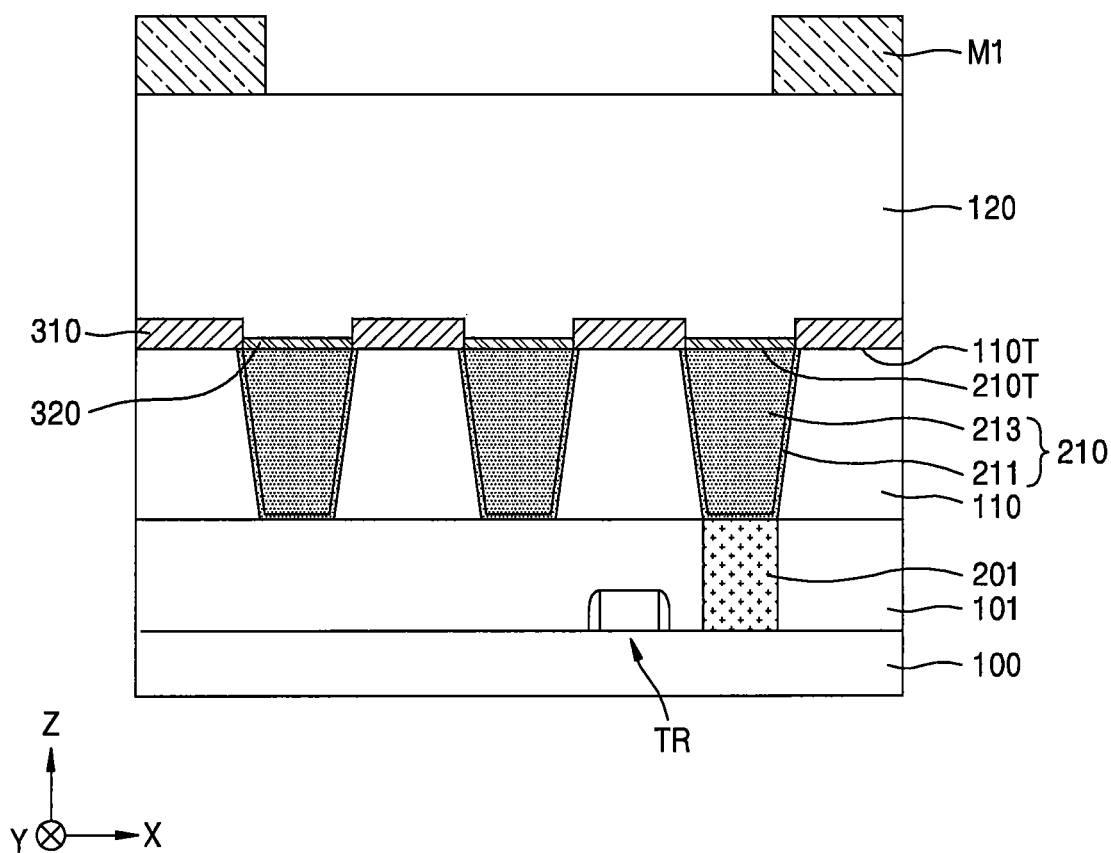

Referring to FIG. 8D, the second insulation layer 120 may be formed on the etch stop layer 310 and the capping layer 320.

A lower surface of the second insulation layer 120 may be formed to conformally cover or overlap an upper surface 310T of the etch stop layer 310 and an upper surface 320T of the capping layer 320. Therefore, the lower surface of the second insulation layer 120 may be formed to have a concave-convex structure having a phase opposite to that of a concave-convex structure of each of the etch stop layer 310 and the capping layer 320. In other words, the lower surface of the second insulation layer 120 may be formed conformally over the etch stop layer 310 and an upper surface 320T of the capping layer 320.

A mask pattern M1 may be formed on the second insulation layer 120 through a lithography process. A photoresist may be coated, and the mask pattern M1 may be formed by patterning the photoresist through an exposure process and a development process. Here, a region where an upper wiring structure 220 (see FIG. 8G) is to be formed may be defined by the mask pattern M1.

Figure 8E:
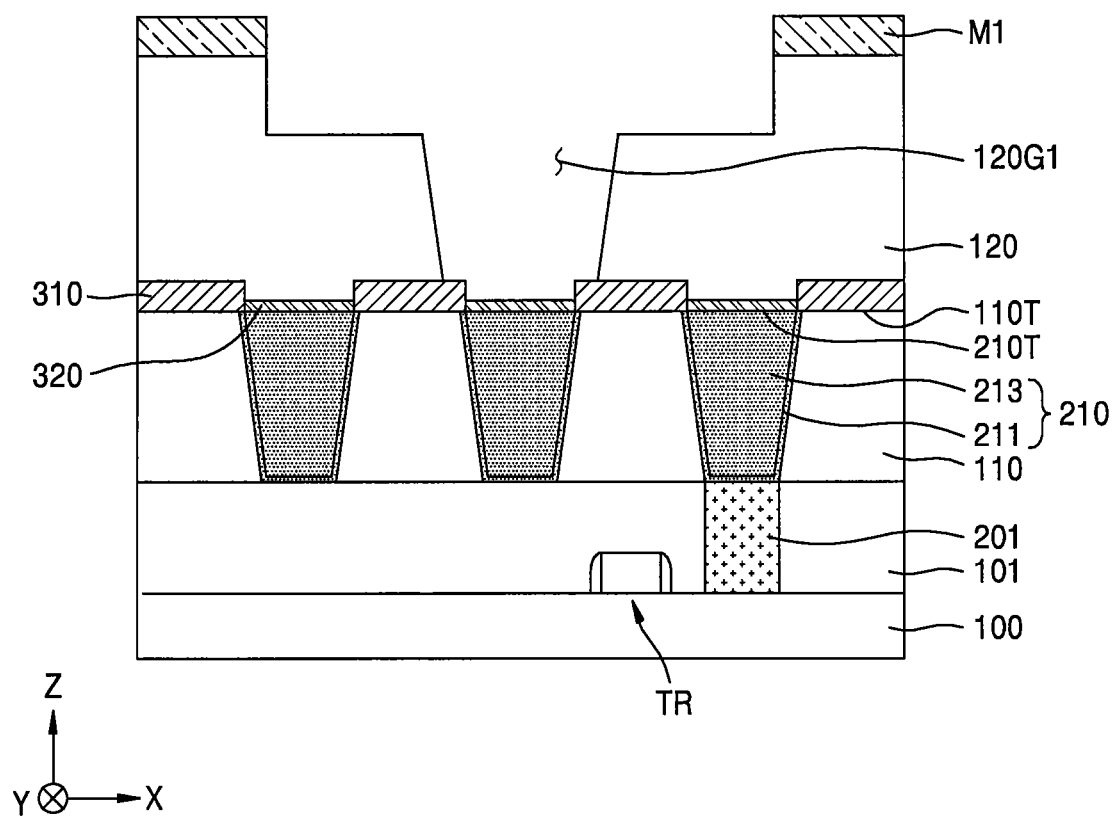

Referring to FIG. 8E, the second insulation layer 120 may be etched by using the mask pattern M1 as an etch mask.

By adjusting an etching condition, an etching process may be stopped by the etch stop layer 310. Therefore, the etching process may be performed until the upper surface 310T of the etch stop layer 310 and the upper surface 320T of the capping layer 320 are exposed. That is, a first groove 120G1 may be formed in the second insulation layer 120.

Subsequently, the mask pattern M1 may be removed by using an ashing process and/or a strip process. A process of removing the mask pattern M1 may be performed under a condition where damage to the second insulation layer 120, the etch stop layer 310, and the capping layer 320 are prevented or reduced.

Figure 8F:
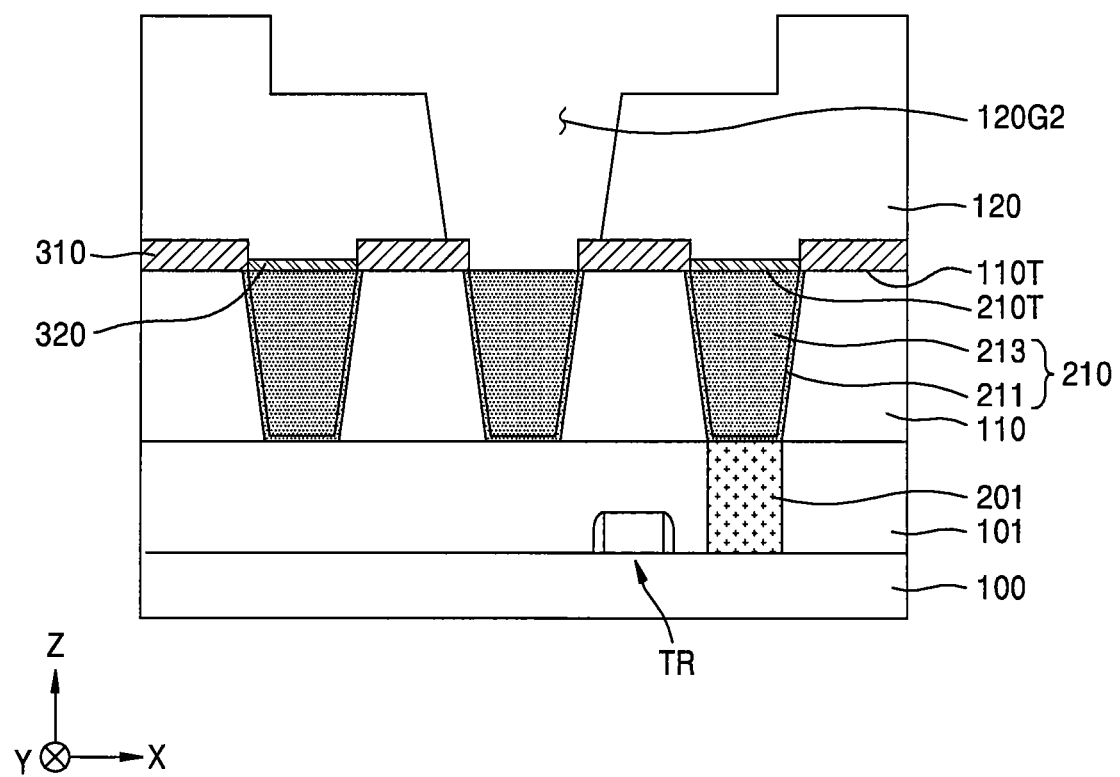

Referring to FIG. 8F, the capping layer 320, which is exposed, may be etched by using each of the second insulation layer 120 and the etch stop layer 310 as an etch mask.

By adjusting an etching condition, only the capping layer 320, which is exposed, may be etched without etching the second insulation layer 120 and the etch stop layer 310. Therefore, an etching process may be performed so that an upper surface of the metal layer 213 is exposed. That is, a second groove 120G2 may be formed in the second insulation layer 120.

Figure 8G:
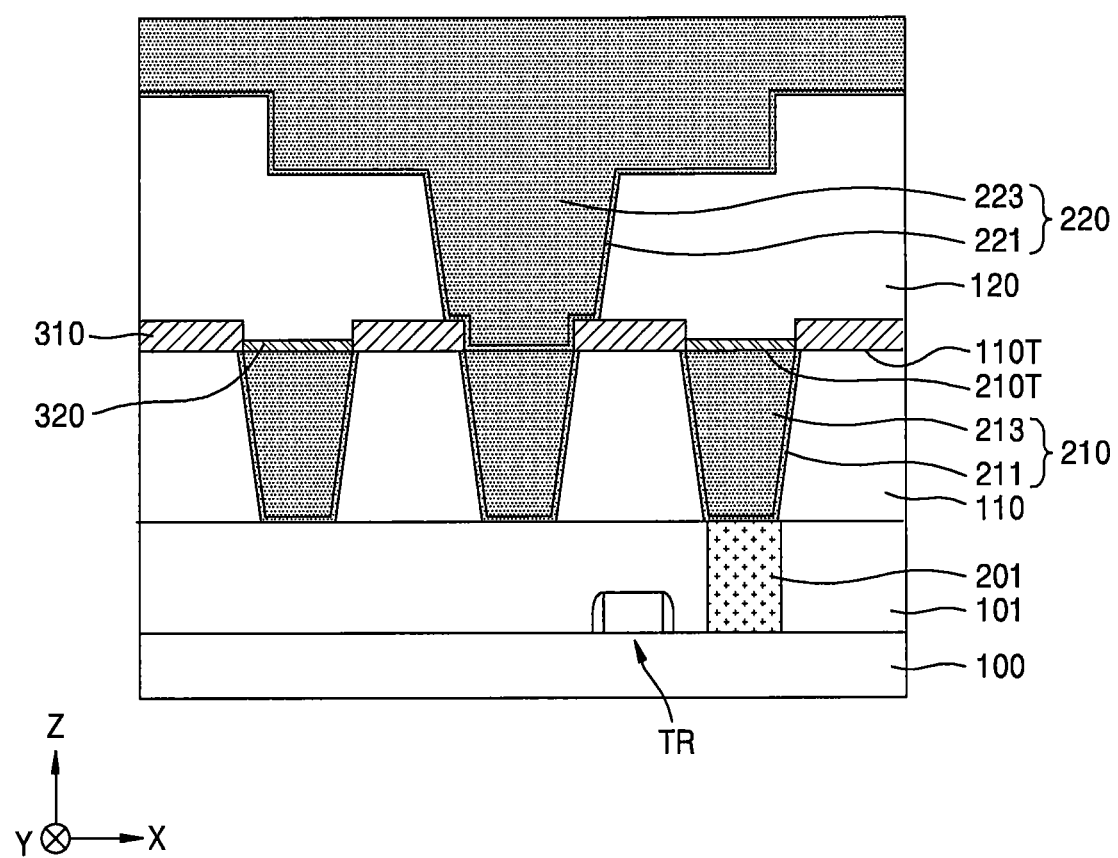

Referring to FIG. 8G, a conductive barrier layer 221 may be formed on an inner wall of the second groove 120G2 and an upper surface of the second insulation layer 120, and the metal layer 223 filled into the second groove 120G2 may be formed on the conductive barrier layer 221.

The conductive barrier layer 221 may be conformally formed to cover or overlap the second insulation layer 120, the etch stop layer 310, and the lower wiring structure 210, which are exposed at the second groove 120G2. The metal layer 223 at least partially filled into the second groove 120G2 may be formed on the conductive barrier layer 221. A dual damascene process may be performed on the conductive barrier layer 221 and the metal layer 223.

Referring again to FIG. 1A, subsequently, a resultant material including the conductive barrier layer 221 and the metal layer 223 may be polished through a chemical mechanical polishing (CMP) process so that an upper surface of the second insulation layer 120 is exposed, and thus, the conductive barrier layer 221 and the metal layer 223 may remain in only the inside of the second groove 120G2. As a result, the upper wiring structure 220 filled into the second groove 120G2 may be formed.

Figure 9:
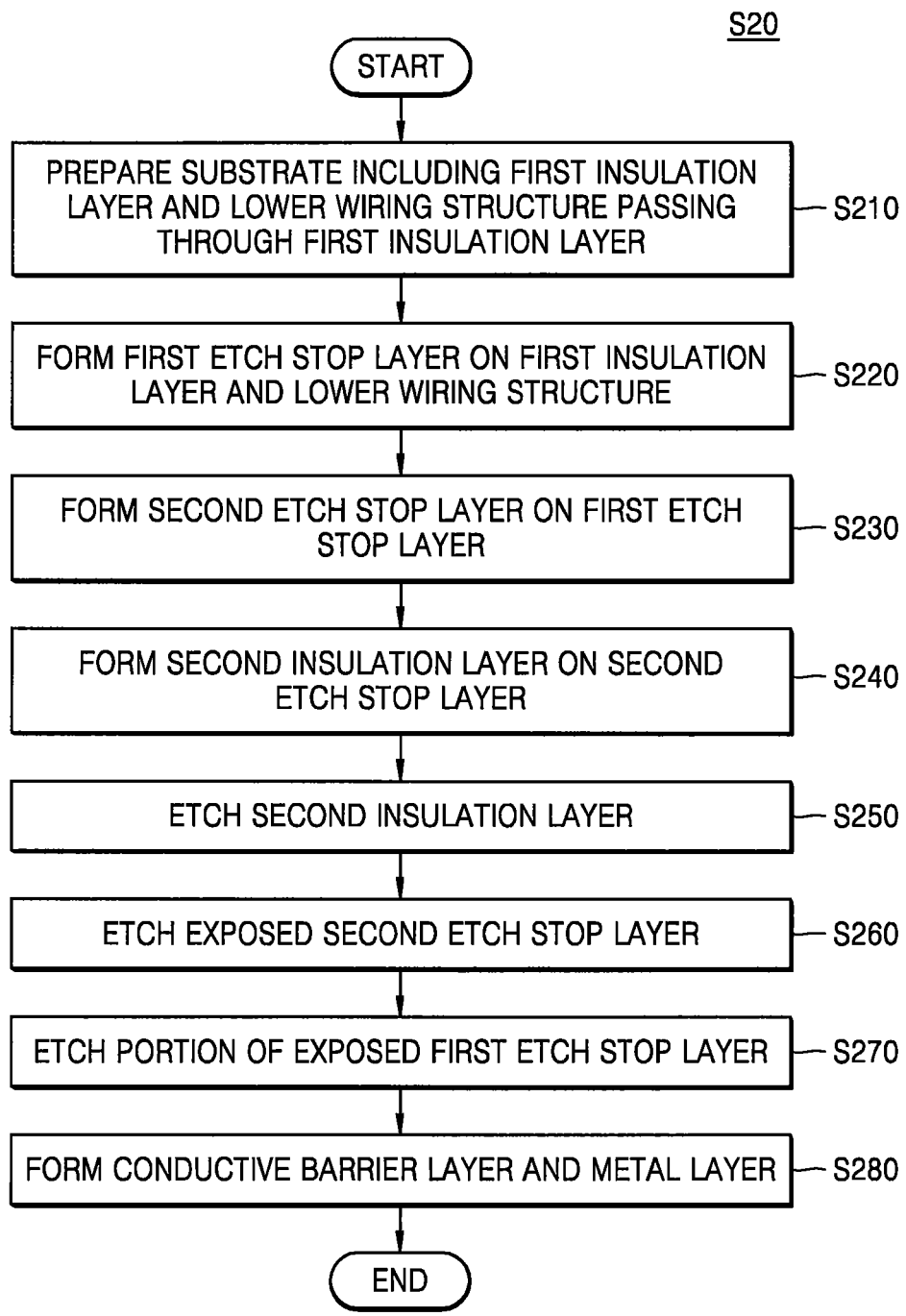
FIG. 9 is a flowchart illustrating a method of manufacturing an integrated circuit device, according to some embodiments.

FIG. 9 is a flowchart illustrating a method S20 of manufacturing an integrated circuit device, according to some embodiments.

Referring to FIG. 7, the method S20 of manufacturing the integrated circuit device may include first operation S210 of preparing a substrate including a first insulation layer and a lower wiring structure passing through the first insulation layer, second operation S220 of forming a first etch stop layer on the first insulation layer and the lower wiring structure, third operation S230 of forming a second etch stop layer on the first etch stop layer, fourth operation S240 of forming a second insulation layer on the second etch stop layer, fifth operation S250 of etching the second insulation layer, sixth operation S260 of etching an exposed second etch stop layer, seventh operation S270 of etching a portion of an exposed first etch stop layer, and eighth operation S280 of forming a conductive barrier layer and a metal layer.

The method S20 of manufacturing the integrated circuit device may include first to eight operations S210 to S280 of a manufacturing process. When some embodiments are implemented differently, a specific process may be performed unlike a described sequence. For example, two processes successively described may be substantially performed at the same time and may be performed in a sequence opposite to a described sequence.

Technical features of first to eighth operations S210 to S280 will be described below in detail with reference to FIGS. 10A to 10H.

FIGS. 10A to 10H are cross-sectional views illustrating a method of manufacturing an integrated circuit device in a process sequence, according to some embodiments.

Figure 10A:
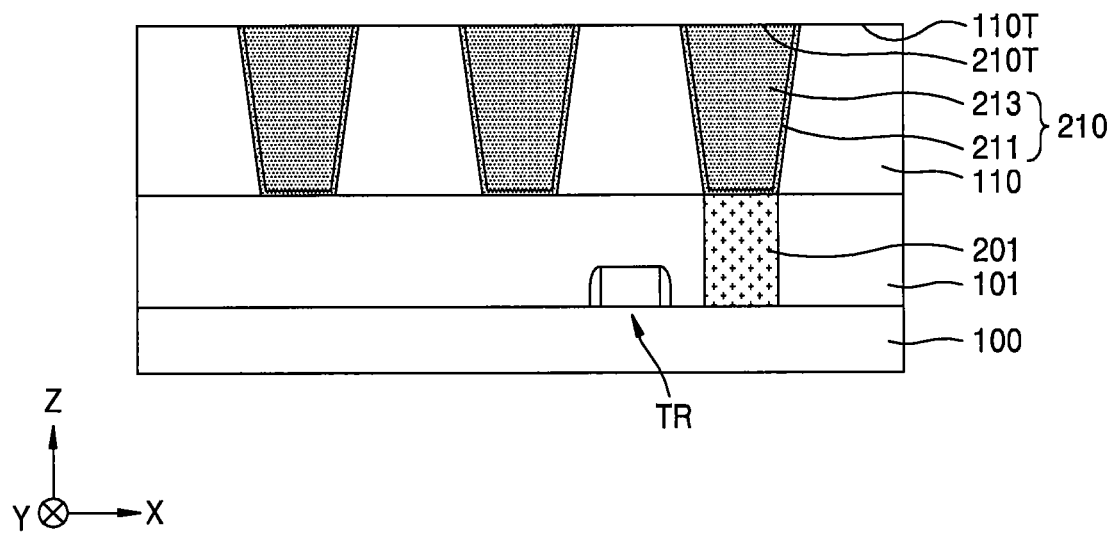
FIGS. 10A to 10H are cross-sectional views illustrating a method of manufacturing an integrated circuit device in a process sequence, according to some embodiments.

Referring to FIG. 10A, a substrate 100 including a first insulation layer 110 and a lower wiring structure 210 passing through the first insulation layer 110 may be prepared.

The substrate 100 may include a wafer including Si. Also, the substrate 100 may include a device region including a transistor TR, an active region, and/or a field region.

An interlayer insulation layer 101 and a contact plug 201 passing through the interlayer insulation layer 101 may be disposed on the substrate 100. In some embodiments, the contact plug 201 may be connected to a source/drain electrode or a gate electrode of the transistor TR formed in the substrate 100.

The first insulation layer 110 may be disposed on the interlayer insulation layer 101. The lower wiring structure 210 may be disposed to pass through the first insulation layer 110. The lower wiring structure 210 may include a metal layer 213 and a conductive barrier layer 211 surrounding the metal layer 213. The lower wiring structure 210 may be connected to the contact plug 201.

Figure 10B:
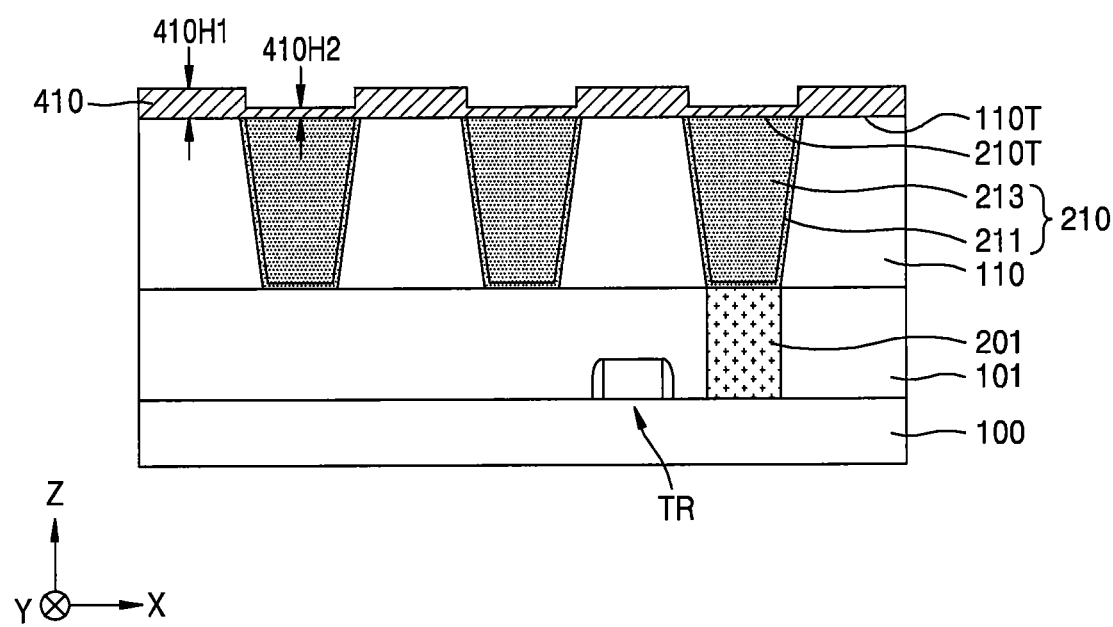

Referring to FIG. 10B, a first etch stop layer 410 may be formed on an upper surface 110T of the first insulation layer 110 and an upper surface 210T of the lower wiring structure 210.

The first etch stop layer 410 may include a first region having a first thickness 410H1 and a second region having a second thickness 410H2, which is less than the first thickness 410H1. The first region may be formed to cover or overlap the upper surface 110T of the first insulation layer 110 and an upper surface of the conductive barrier layer 211, and the second region may be formed to cover or overlap an upper surface of the metal layer 213.

In other words, a thickness of a portion of the first etch stop layer 410 formed on the upper surface 110T of the first insulation layer 110 and the upper surface of the conductive barrier layer 211 may differ from that of a portion of the first etch stop layer 410 formed on the upper surface of the metal layer 213. The first etch stop layer 410 may be selectively formed to be relatively thick on only the upper surface 110T of the first insulation layer 110 and the conductive barrier layer 211. In other words, the thickness of a portion of the first etch stop layer 410 overlapping the lower wiring structure 210 may be less than a thickness of a portion of the first etch stop layer 410 not overlapping the lower wiring structure 210 (i.e., overlapping the first insulation layer 110).

That is, an upper surface 410T of the first etch stop layer 410 may be formed in a concave-convex structure having a step height, and a lower surface of the first etch stop layer 410 may be formed as a substantially flat surface.

Figure 10C:
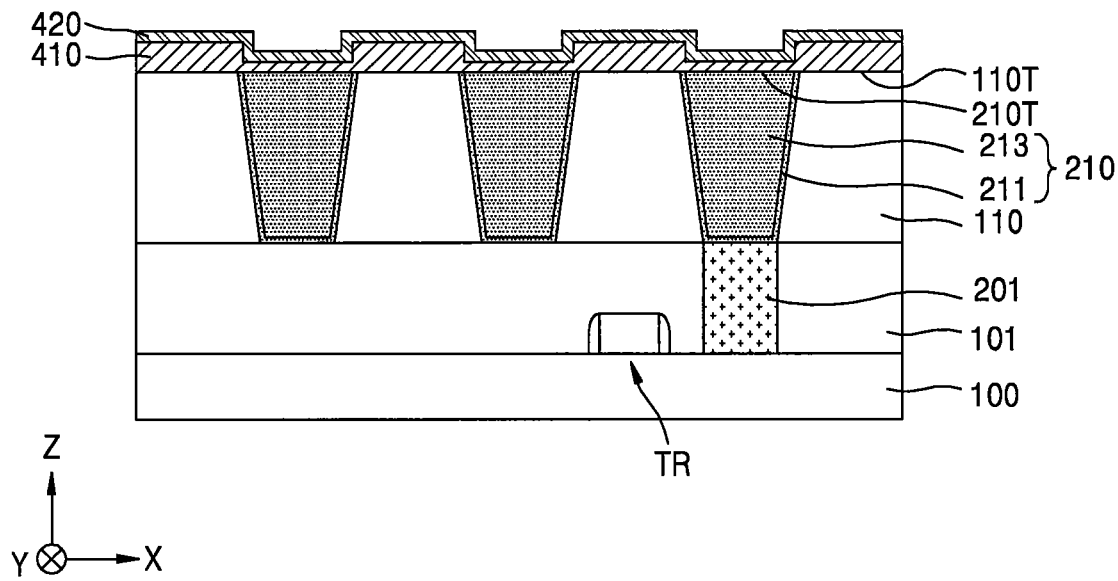

Referring to FIG. 10C, the second etch stop layer 420 may be formed to conformally cover or overlap the first etch stop layer 410.

Because the second etch stop layer 420 is formed to conformally cover or overlap the first etch stop layer 410, the second etch stop layer 420 may be formed in a concave-convex structure having the same phase as that of a concave-convex structure of the first etch stop layer 410.

That is, each of an upper surface and a lower surface of the second etch stop layer 420 may be formed in a concave-convex structure having a step height. Also, the second etch stop layer 420 may include a material having an etch selectivity which differs from that of the first insulation layer 410.

Figure 10D:
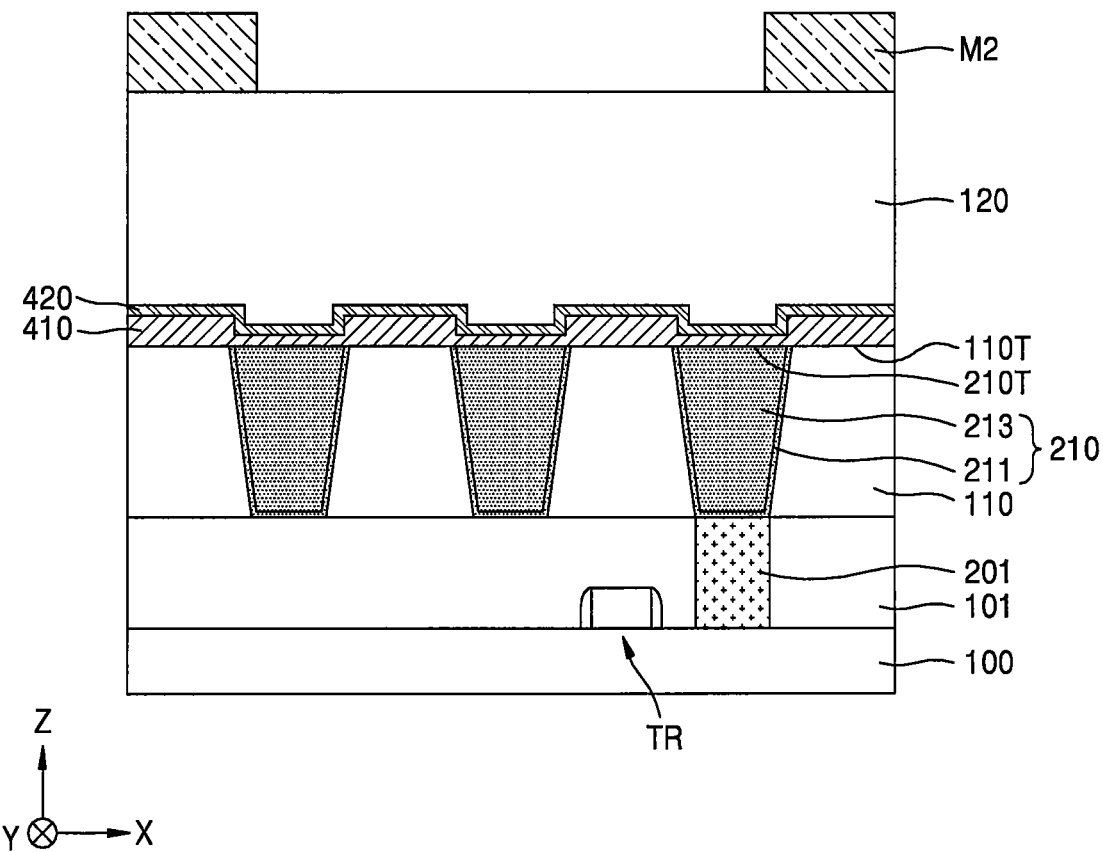

Referring to FIG. 10D, the second insulation layer 120 may be formed on the second etch stop layer 420.

A lower surface of the second insulation layer 120 may be formed to conformally cover or overlap an upper surface of the second etch stop layer 420, and thus, the lower surface of the second insulation layer 120 may be formed to have a concave-convex structure having a phase opposite to that of a concave-convex structure of the second etch stop layer 420. In other words, the lower surface of the second insulation layer 120 may be formed conformally over the second etch stop layer 420.

A mask pattern M2 may be formed on the second insulation layer 120 through a lithography process. A photoresist may be coated, and the mask pattern M2 may be formed by patterning the photoresist through an exposure process and a development process. Here, a region where an upper wiring structure 220 (see FIG. 10H) is to be formed may be defined by the mask pattern M2.

Figure 10E:
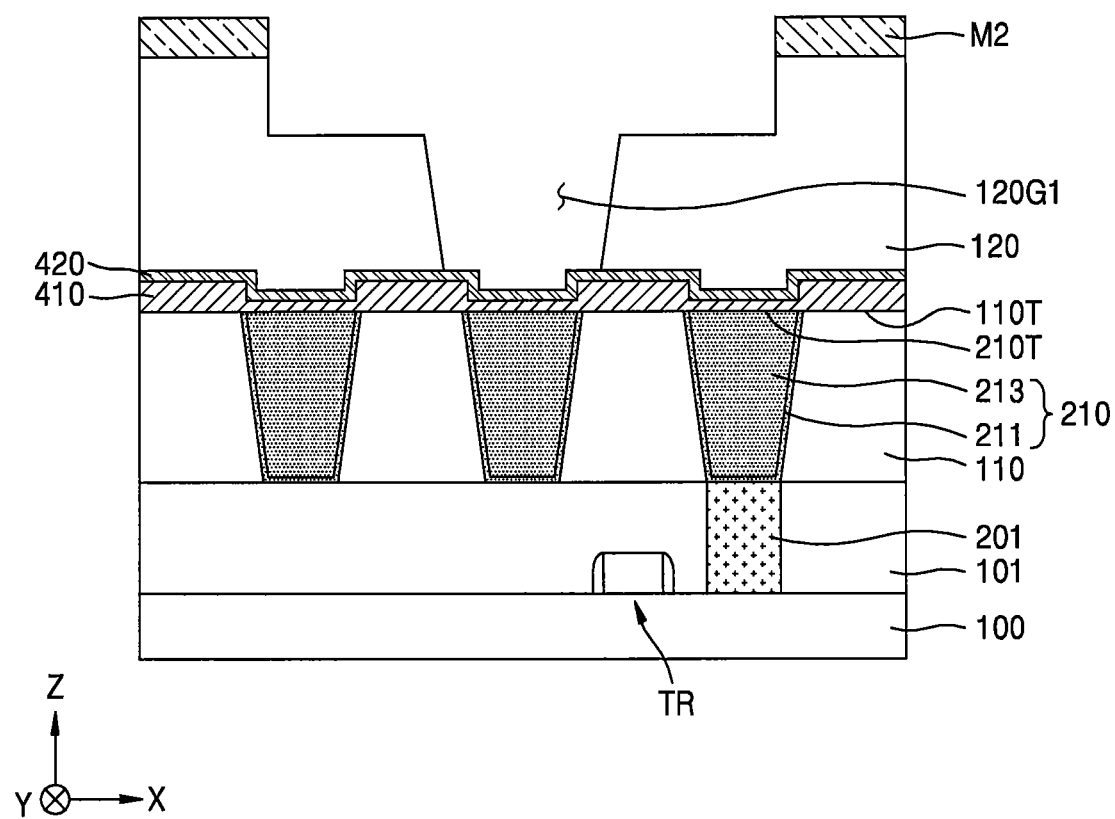

Referring to FIG. 10E, the second insulation layer 120 may be etched by using the mask pattern M2 as an etch mask.

By adjusting an etching condition, an etching process may be stopped by the second etch stop layer 420. Therefore, the etching process may be performed until the upper surface of the second etch stop layer 420 is exposed. That is, a first groove 120G1 may be formed in the second insulation layer 120.

Subsequently, the mask pattern M2 may be removed by using an ashing process and/or a strip process. A process of removing the mask pattern M2 may be performed under a condition where damage to the second insulation layer 120 and the second etch stop layer 420 are prevented or reduced.

Figure 10F:
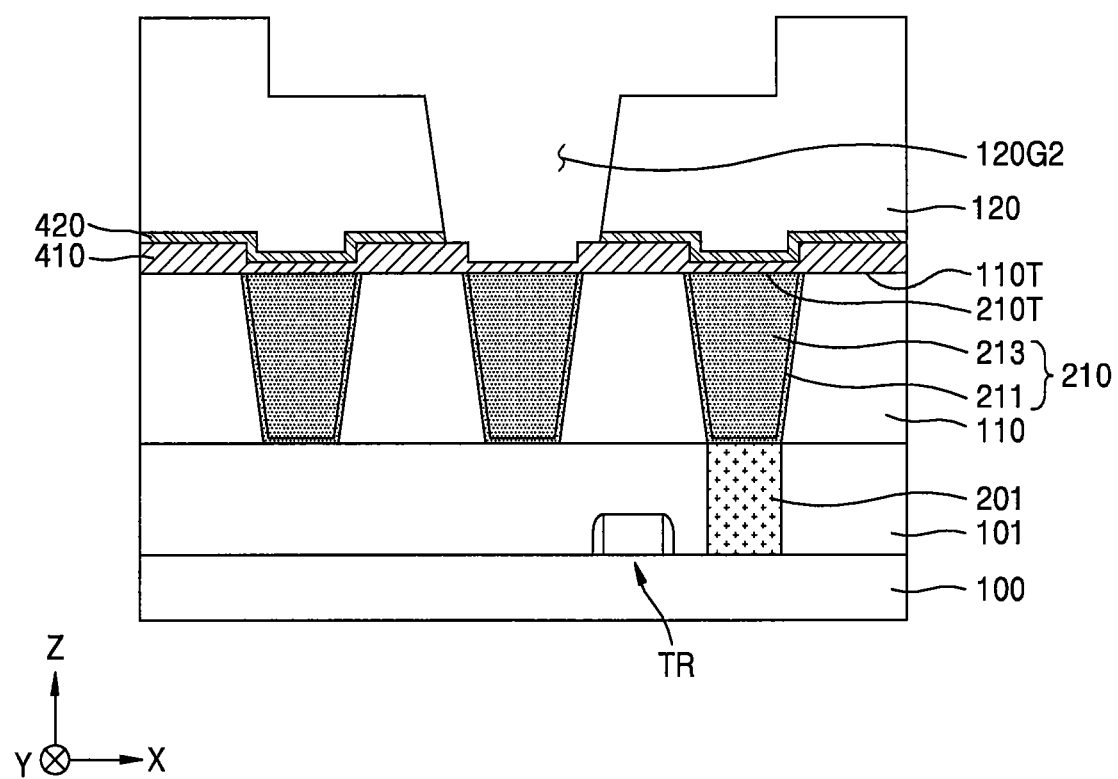

Referring to FIG. 10F, the exposed second etch stop layer 420 may be etched by using the second insulation layer 120 as an etch mask.

By adjusting an etching condition, only the exposed second etch stop layer 420 may be etched without etching the second insulation layer 120. Therefore, an etching process may be performed so that an upper surface of the first etch stop layer 410 is exposed. That is, a second groove 120G2 may be formed in the second insulation layer 120.

Figure 10G:
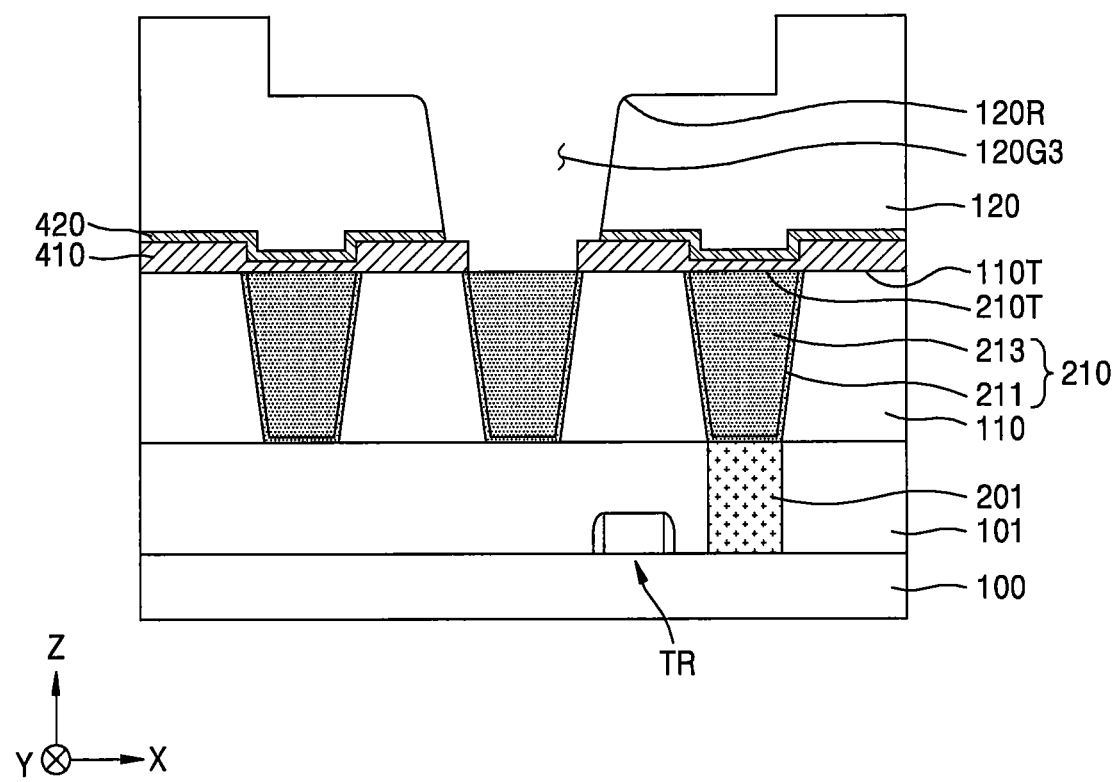

Referring to FIG. 10G, the exposed first etch stop layer 410 may be etched by using the second insulation layer 120 as an etch mask.

By adjusting an etching condition, only a portion of the exposed first etch stop layer 410 may be etched. Therefore, an etching process may be performed so that an upper surface of the metal layer 213 is exposed. Also, by adjusting the etching condition, a round corner 120R may be formed in the second insulation layer 120. That is, a third groove 120G3 may be formed in the second insulation layer 120.

Figure 10H:
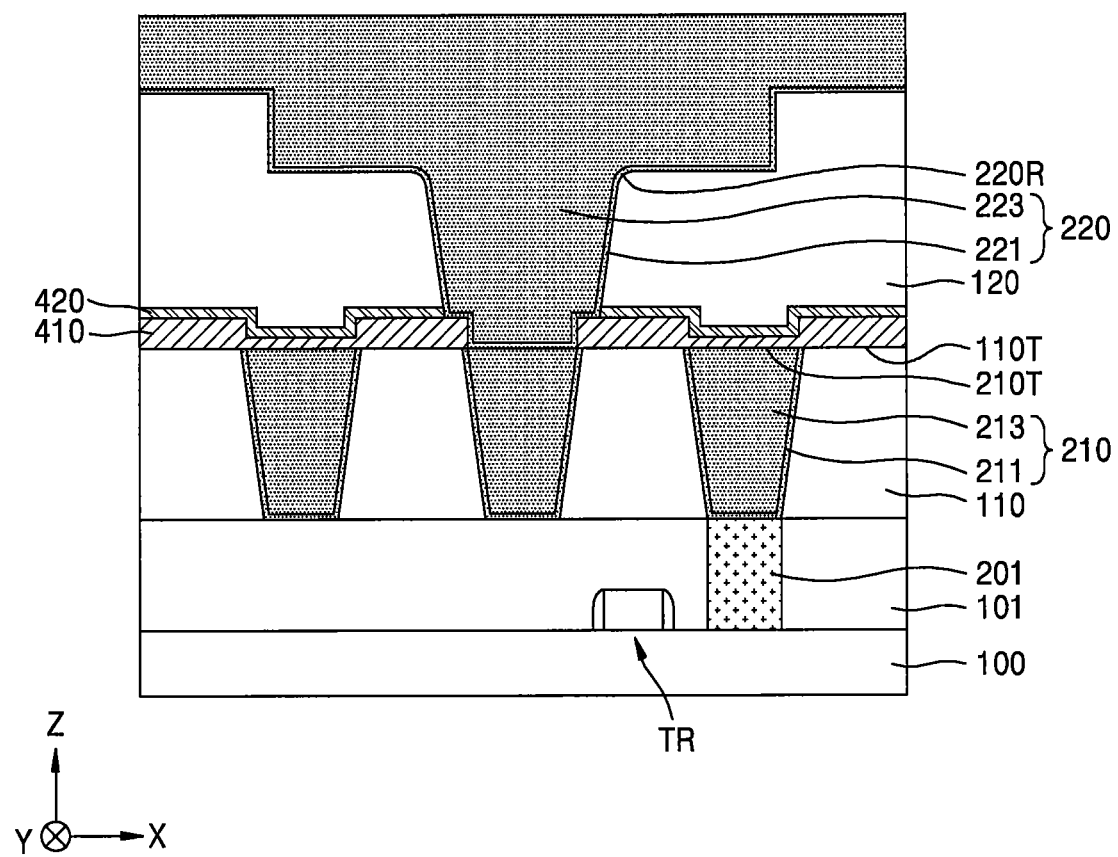

Referring to FIG. 10H, a conductive barrier layer 221 may be formed on an inner wall of the third groove 120G3 and an upper surface of the second insulation layer 120, and the metal layer 223 filled into the third groove 120G3 may be formed on the conductive barrier layer 221.

The conductive barrier layer 221 may be conformally formed to cover or overlap the second insulation layer 120, the first etch stop layer 410, the second etch stop layer 420, and the metal layer 213 which are exposed at the third groove 120G3. The metal layer 223 filled into the third groove 120G3 may be formed on the conductive barrier layer 221. A dual damascene process may be performed on the conductive barrier layer 221 and the metal layer 223. At this time, due to the round corner 120R of the second insulation layer 120, a fill process of at least partially filling or completely filling the metal layer 223 and the conductive barrier layer 221 may be efficiently performed.

Referring again to FIG. 5A, subsequently, a resultant material including the conductive barrier layer 221 and the metal layer 223 may be polished through a CMP process so that an upper surface of the second insulation layer 120 is exposed, and thus, the conductive barrier layer 221 and the metal layer 223 may remain in only the inside of the third groove 120G3. As a result, the upper wiring structure 220 filled into the third groove 120G3 may be formed. The upper wiring structure 220 may include a round corner 220R.

Figure 11:
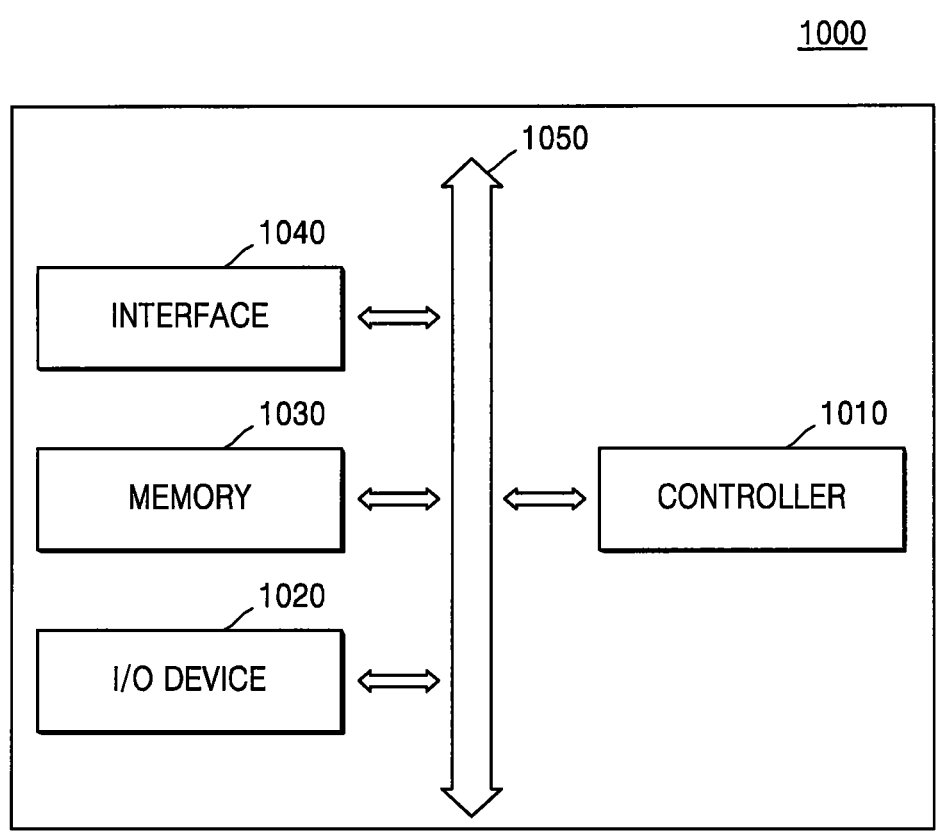
FIG. 11 is a block diagram illustrating a system including an integrated circuit device according to some embodiments.

FIG. 11 is a block diagram illustrating a system 1000 including an integrated circuit device according to some embodiments.

Referring to FIG. 11, the system 1000 may include a controller 1010, an input/output (I/O) device 1020, a memory 1030, an interface 1040, and a bus 1050.

The system 1000 may be a mobile system or a system which transmits or receives information. In some embodiments, the mobile system may be a portable computer, a tablet mobile phone, a digital music player, a memory card, or the like.

The controller 1010 may be for controlling an execution program in the system 1000 and may be configured with a microprocessor, a digital signal processor, a microcontroller, or a device similar thereto.

The I/O device 1020 may be used to input or output data of the system 1000. The system 1000 may be connected to an external device (for example, a computer or a network) by using the I/O device 1020 and may exchange data with the external device. The I/O device 1020 may be, for example, a touch pad, a keyboard, a computer mouse, or a display device.

The memory 1030 may store data for an operation of the controller 1010, or may store data obtained through processing by the controller 1010. The memory 1030 may include one of the integrated circuit devices 10 to 60 according to some embodiments described above with reference to FIGS. 1A to 6.

The interface 1040 may be a data transmission path between the system 1000 and the external device. The controller 1010, the I/O device 1020, the memory 1030, and the interface 1040 may communicate with one another through the bus 1050.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a first insulation layer on a substrate;
a lower wiring structure in the first insulation layer and comprising a metal layer and a conductive barrier layer, wherein the metal layer is on the conductive barrier layer;
an etch stop layer overlapping an upper surface of the first insulation layer and an upper surface of the conductive barrier layer and having a first thickness;
a capping layer overlapping a first portion of the upper surface of the metal layer and having a second thickness which is less than the first thickness;

a second insulation layer overlapping the etch stop layer and the capping layer; and an upper wiring structure connected to a second portion of the upper surface of the metal layer not overlapped by the capping layer, wherein the upper wiring structure is in the second insulation layer, and wherein the upper wiring structure comprises a concave-convex structure contacting a portion of an upper surface of the etch stop layer, a sidewall of the etch stop layer, and the second portion of the upper surface of the metal layer.

2. The integrated circuit device of claim 1, wherein a lower surface of the second insulation layer comprises a concave-convex structure conformally overlapping the etch stop layer and the capping layer.

3. The integrated circuit device of claim 1, wherein a dielectric constant of a material of the etch stop layer is greater than a dielectric constant of a material of the second insulation layer.

4. The integrated circuit device of claim 3, wherein the etch stop layer comprises a single layer or a composite layer comprising at least one material selected from among aluminum oxide ($Al_xO_y$), zirconium oxide ($Zr_xO_y$), or hafnium oxide ($Hf_xO_y$).

5. The integrated circuit device of claim 1, wherein the capping layer comprises a single layer or a composite layer comprising a carbon-containing layer and/or at least one material selected from among titanium (Ti), molybdenum (Mo), tantalum (Ta), manganese (Mn), cobalt (Co), or ruthenium (Ru).

6. The integrated circuit device of claim 1, wherein the upper surface of the etch stop layer comprises a round corner that contacts the upper wiring structure.

7. The integrated circuit device of claim 1,
wherein the upper wiring structure comprises an upper structure and a lower structure,
wherein the upper structure comprises a wiring line extending in a direction vertical to the lower wiring structure, and
wherein the lower structure comprises a via intersecting the wiring line.

8. The integrated circuit device of claim 7,
wherein as seen from a side cross-sectional surface, the etch stop layer comprises a plurality of etch stop layers that are spaced apart from each other by ones of a plurality of metal layers therebetween, and
wherein a lower surface of the via contacts a portion of an upper surface of adjacent ones of the plurality of etch stop layers.

9. The integrated circuit device of claim 1, wherein the etch stop layer and the capping layer are not on the second portion of the upper surface of the metal layer.

10. The integrated circuit device of claim 1, wherein the sidewall of the etch stop layer contacts a sidewall of the capping layer.

11. An integrated circuit device comprising:
a first insulation layer on a substrate;
a first wiring structure in the first insulation layer and comprising a metal layer and a conductive barrier layer, wherein the metal layer is on the conductive barrier layer;
an etch stop layer overlapping an upper surface of the first insulation layer and an upper surface of the conductive barrier layer and having a first thickness;
a capping layer overlapping a first portion of the upper surface of the metal layer and having a second thickness which is less than the first thickness;
a second insulation layer overlapping the etch stop layer and the capping layer;
a second wiring structure on the second insulation layer;
an $N^{th}$ insulation layer and an $N^{th}$ wiring structure sequentially stacked on the second insulation layer and the second wiring structure, wherein N is an integer greater than or equal to 3; and
a via structure connected to a second portion of the upper surface of the metal layer not overlapped by the capping layer,
wherein the via structure penetrates the second to $N^{th}$ insulation layers, and
wherein the via structure comprises a concave-convex structure contacting a portion of an upper surface of the etch stop layer, a sidewall of the etch stop layer, and the second portion of the upper surface of the metal layer.

12. The integrated circuit device of claim 11,
wherein a lower surface of the second insulation layer comprises a concave-convex structure conformally overlapping the etch stop layer and the capping layer, and
wherein a lower surface of the $N^{th}$ insulation layer comprises a substantially flat surface overlapping an upper surface of an $N-1^{th}$ insulation layer and an upper surface of an $N-1^{th}$ wiring structure.

13. The integrated circuit device of claim 11, wherein the via structure does not contact the second to $N^{th}$ wiring structures.

14. The integrated circuit device of claim 11,
wherein the etch stop layer comprises a plurality of etch stop layers,
wherein ones of the plurality of etch stop layers are spaced apart from each other by ones of a plurality of metal layers therebetween, and
wherein a lower surface of the via structure contacts a portion of an upper surface of an adjacent one of the plurality of etch stop layers.

15. The integrated circuit device of claim 11,
wherein the etch stop layer comprises a single layer or a composite layer comprising at least one material selected from among aluminum oxide ($Al_xO_y$), zirconium oxide ($Zr_xO_y$), or hafnium oxide ($Hf_xO_y$), and
wherein the capping layer comprises a single layer or a composite layer comprising a carbon-containing layer and/or at least one material selected from among titanium (Ti), molybdenum (Mo), tantalum (Ta), manganese (Mn), cobalt (Co), or ruthenium (Ru).

16. An integrated circuit device comprising:
a first insulation layer on a substrate;
a lower wiring structure in the first insulation layer and comprising a metal layer and a conductive barrier layer, wherein the metal layer is on the conductive barrier layer;
a first etch stop layer comprising a first region having a first thickness and a second region having a second thickness which is less than the first thickness, the first region overlapping an upper surface of the first insulation layer and an upper surface of the conductive barrier layer, and the second region overlapping a first portion of an upper surface of the metal layer;
a second etch stop layer overlapping the first etch stop layer;
a second insulation layer overlapping the second etch stop layer; and an upper wiring structure connected to a second portion of the upper surface of the metal layer not overlapped by the first etch stop layer and the second etch stop layer, wherein the upper wiring structure penetrates the second insulation layer, and wherein the upper wiring structure comprises a wiring line extending in a direction vertical to the lower wiring structure and a via intersecting the wiring line, wherein an upper surface of the via comprises a rounded corner, and wherein a lower surface of the via comprises a concave-convex structure contacting a portion of an upper surface of the first etch stop layer, a sidewall of the first etch stop layer, and the upper surface of the metal layer.

17. The integrated circuit device of claim 16, wherein a lower surface of the second insulation layer comprises a concave-convex structure conformally overlapping an upper surface of the second etch stop layer.

18. The integrated circuit device of claim 16, wherein a lower surface of the first etch stop layer comprises a substantially flat surface, and wherein a lower surface of the second etch stop layer comprises a concave-convex structure.

19. The integrated circuit device of claim 16, wherein a dielectric constant of a material of the second etch stop layer is greater than a dielectric constant of a material of the first etch stop layer.

20. The integrated circuit device of claim 19, wherein the first etch stop layer comprises at least one material selected from among silicon oxide ($Si_xO_y$), silicon oxynitride ($Si_xO_yN_z$), or silicon oxycarbide ($Si_xO_yC_z$), and wherein the second etch stop layer comprises at least one material selected from among aluminum oxide ($Al_xO_y$), zirconium oxide ($Zr_xO_y$), or hafnium oxide ($Hf_xO_y$).

* * * * *